United States Patent [19]

Maki et al.

[11] Patent Number: 4,912,348

[45] Date of Patent: Mar. 27, 1990

[54] METHOD FOR DESIGNING PASS TRANSISTOR ASYNCHRONOUS SEQUENTIAL CIRCUITS

[75] Inventors: Gary K. Maki; Sterling R. Whitaker, both of Moscow, Id.

[73] Assignee: Idaho Research Foundation, Moscow, Id.

[21] Appl. No.: 282,308

[22] Filed: Dec. 9, 1988

[51] Int. Cl.⁴ .................... H04Q 1/00; H03K 17/693; H03K 19/096; H03K 3/01

[52] U.S. Cl. .................................... 307/465; 307/468; 307/469; 307/465.1; 364/716; 364/784; 340/825.84; 340/825.86; 340/825.87; 340/825.91

[58] Field of Search ............... 307/465, 466, 467, 468, 307/469, 471, 443, 448, 451, 452, 453, 465.1; 364/716, 784; 340/825.83–825.91

[56] References Cited

U.S. PATENT DOCUMENTS

| | | | |
|---|---|---|---|
| 3,400,379 | 9/1968 | Harman | 235/156 |
| 4,453,096 | 6/1984 | Le Can et al. | 307/448 |
| 4,808,844 | 2/1989 | Ozaki et al. | 307/465.1 X |
| 4,825,107 | 4/1989 | Naganuma et al. | 307/465 |
| 4,857,773 | 8/1989 | Takata et al. | 307/465 |
| 4,857,774 | 8/1989 | El-Ayat et al. | 307/465 |
| 4,870,302 | 10/1989 | Freeman | 307/465 |

*Primary Examiner*—Stanley D. Miller
*Assistant Examiner*—David R. Bertelson
*Attorney, Agent, or Firm*—Limbach, Limbach & Sutton

[57] ABSTRACT

A method for designing and constructing pass transistor asynchronous sequential circuits, and a class of pass transistor asynchronous sequential circuits designed in accordance with the inventive method. The inventive circuit design method generates a design for each next state variable, $Y_i$, of an asynchronous pass transistor circuit, where each design corresponds to a portion of the circuit. In a first preferred embodiment, the invention produces an asynchronous circuit design comprising a pass transistor network and a buffer (having no long term memory) for receiving the output of the pass transistor network. In a second preferred embodiment, the inventive method results in a critical race free, asynchronous circuit design comprising an enable pass transistor network, a disable pass transistor network, and a buffer (including a memory) for receiving the output of both pass transistor networks. In either embodiment, the invention results in circuits comprising pass transistor networks that are identical in structure for each next state variable $Y_i$ (although different sets of constant input signals are applied to each network). It is within the scope of the invention to design and construct circuits having this architecture in accordance with a structured layout including an input section, a logic section implementing the next state functions, a buffer section, and a feedback section. The logic section preferably includes a pass transistor matrix programmed with either a diffusion-contact-metal transistor structure or a metal jumper structure. The feedback lines preferably are metal lines that are programmed by making contact with the gate lines feeding the pass transistors.

39 Claims, 7 Drawing Sheets

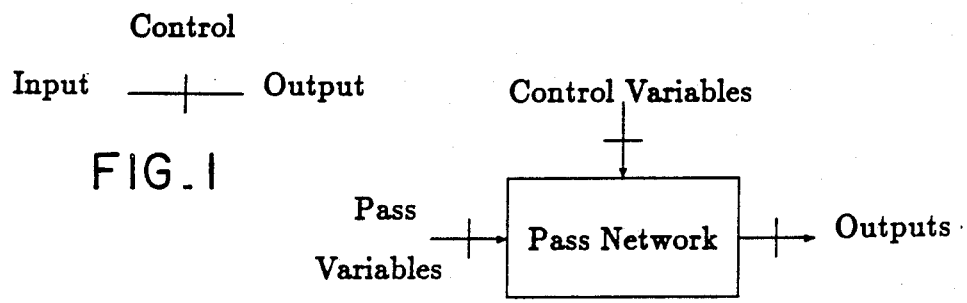
FIG. 1
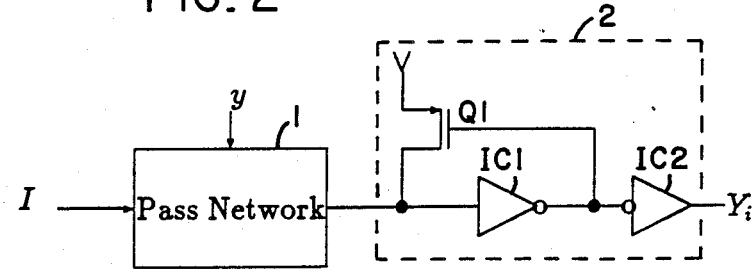
FIG. 2
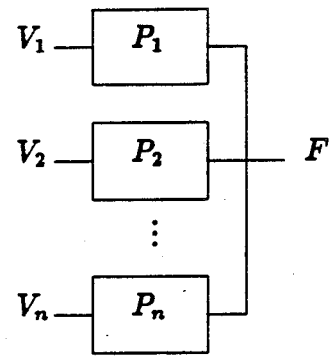
FIG. 4
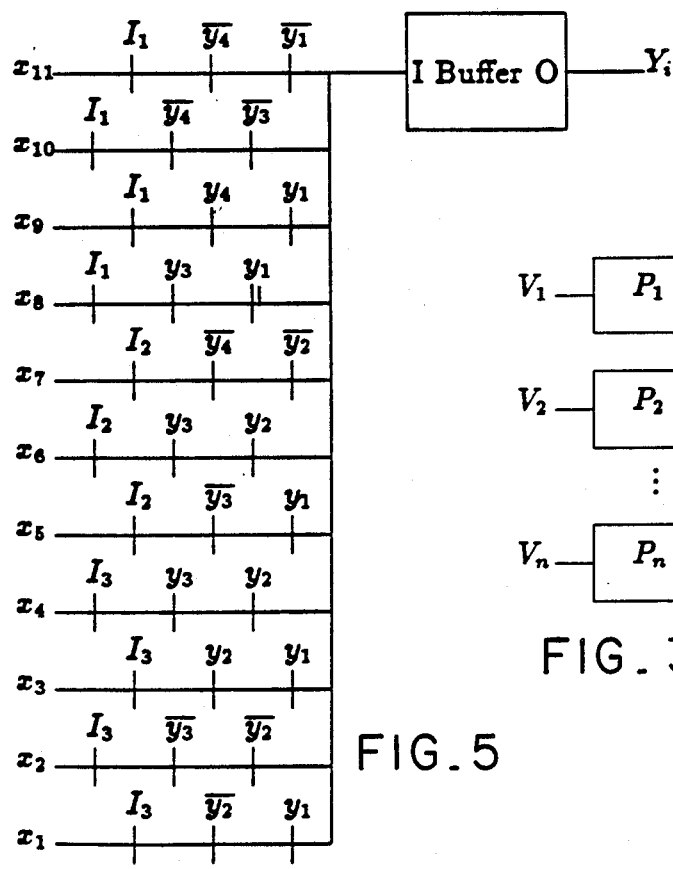
FIG. 5
FIG. 3

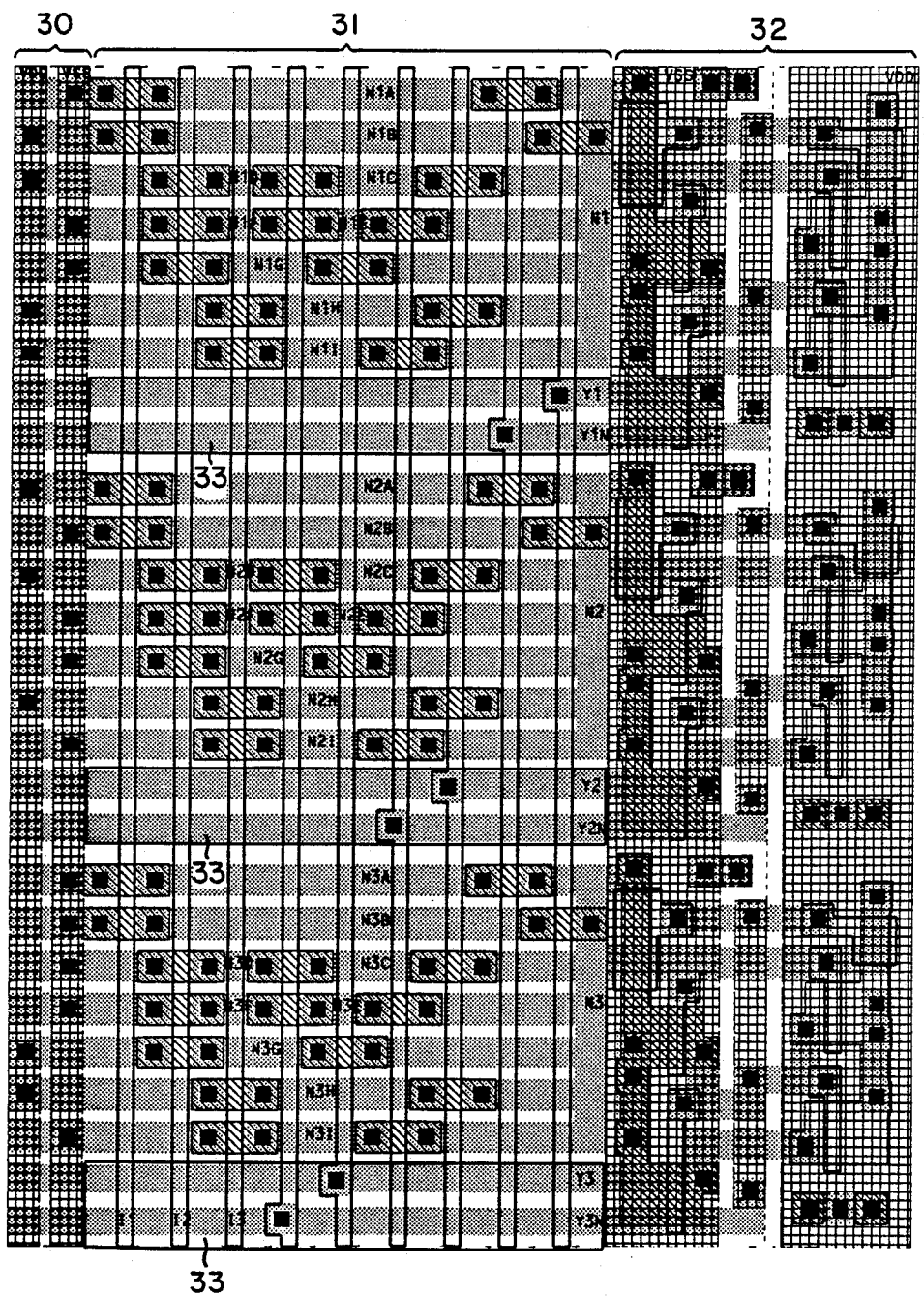
FIG_16

METHOD FOR DESIGNING PASS TRANSISTOR ASYNCHRONOUS SEQUENTIAL CIRCUITS

FIELD OF THE INVENTION

The invention relates to methods for designing and constructing asynchronous sequential circuits of the type including one or more pass transistors, and to pass transistor asynchronous sequential circuits designed in accordance with such methods.

BACKGROUND OF THE INVENTION

The predominant approach currently used in the design of logic circuits requires synchonous circuit operation (i.e., operation synchronized with a clock signal). The vast majority of sequential circuits currently implemented with Very Large Scale Integrated (VLSI) circuit technology are designed in accordance with synchronous design theory. However, use of synchronous design in VLSI circuits has several disadvantages.

One assumption that avoids race conditions (i.e., internal transitions in which at least two internal state variables change simultaneously) with synchronous circuit design is that all signals must finish propagating before the next sampling clock edge. This simplifying design assumption affects the speed of a synchronous circuit which is thereby governed by the slowest functional block. Clock lines in synchronous VLSI circuitry thus must be distributed so that clock skew between logic sections due to propagation of the clock signal is within an allowable limit to avoid having race conditions introduced by this skew. In order to minimize skew and also overcome the essential hazards inherent in most synchronous flip flops, clock drivers must be sized to have very fast rise and fall times. Most of the instantaneous power drawn by a synchronous VLSI circuit occurs at the clock edges due to the current drawn by the large clock drivers and the nodes set in motion by the clock edge. A major design consideration for VLSI chips is to size the power busses to account for this peak current draw.

Asynchronous design is a solution to these and to other problems with synchronous circuit design. Each section of an asynchronous circuit operates independently at each such section's inherent maximum rate of speed, and thus the overall system speed is not governed by the slowest section of the logic. No synchronizing clock needs to be distributed, thus avoiding races introduced due to clock skew and the design effort to distribute the clock signal properly. Power requirements are also reduced since no clock drivers are required and the logical nodes are not all triggered to undergo simultaneous transitions.

Pass transistor networked have been used to form combinational logic structures in MOS VLSI logic circuits. Early circuits using pass transistors were designed to reduce power, delay and area for MOS logic circuits. Pass transistors were used in NMOS designs to steer and block logic signals in flip flops, latches and selector circuits, as well as in some combinational circuits such as carry chains. Formal techniques for the design of NMOS pass transistor circuits, and portions of several NMOS VLSI custom chip designs, are described in the following U.S. Patents issued to S. R. Whitaker, one of the present inventors: U.S. Pat. No. 4,541,067, issued Sept. 10, 1985; U.S. Pat. No. 4,566,064, issued Jan. 21, 1986; and U.S. Pat. No. 4,622,648, issued Nov. 11, 1986.

However, the use of pass transistors in sequential circuits has been limited to the combinational next state forming logic in synchronous sequential machines. Asynchronous sequential pass transistor circuits have not been developed.

To simplify the description of the invention, it will be helpful to summarize relevant conventional pass transistor circuit terminology.

The logical function of a pass transistor is described in Table 1:

TABLE 1

| Control | Input | Output |
|---------|-------|--------|
| 0 | 0 | — |
| 0 | 1 | — |
| 1 | 0 | 0 |
| 1 | 1 | 1 |

When the "control" terminal of a pass transistor is high, the logic level presented at the input is passed to the output. When the control terminal is low, the output is in a floating or high impedance state. The simplest model of the pass gate would be a switch closed under the appropriate control condition and open under the opposite control condition.

A single NMOS or PMOS transistor can be used to implement the pass transistor function, although two transistors (an NMOS and PMOS transistor) are at times used to implement a single pass gate. A MOS transistor is bidirectional and there is not physical distinction between the source and drain terminals. When a MOS transistor is used to implement a pass transistor function, the terms input and output must be defined by the circuitry connected to the drain and source terminals of the MOSFET. The input to a pass transistor is the terminal connected to the source of logic state. The output of a pass transistor applies the logic state present on the pass transistor's input to the input of another logic gate.

The logical function of a single pass transistor will be represented schematically in this Specification by the symbol in FIG. 1. When PMOS transistors are used in conjunction with NMOS transistors, a letter ("p" or "n") designating the transistor as PMOS (p) or NMOS (n) will be added to the diagram. The "(p)(n)" notation also clarifies the logic state necessary on the control port to cause the logic level on the input to be passed to the output.

Combinational logic networks are formed by joining the outputs and inputs of sets of pass transistors. Outputs for pass transistors can be joined together, if all paths to the output that may be simultaneously enabled will pass the same logic state (to avoid conflict). A general combinational pass transistor network is shown in FIG. 2.

A set of control variables, C, drives the control terminals of a pass transistor network. Given a set of n boolean inputs, I, such that $$I = x_1, x_2, \ldots, x_n$$

then, $$C \subset [x_1, \overline{x_1}, x_2, \overline{x_2}, \ldots, x_n, \overline{x_n}].$$

A set of pass variable, V, drive the inputs of the pass network and are passed to the output of the pass network, so that:

$$V \subset [x_1, \overline{x_1}, x_2, \overline{x_2}, \ldots, x_n, \overline{x_n}, 0, 1].$$

A pass network can be represented as shown in FIG. 3. Each section labeled $P_i$ consists of a series of pass transistors. $P_i$ is a product term containing elements of C as literals. Each literal represents an input variable which drives the control gate of a series pass transistor in $P_i$.

The control function of a pass network element is the product term describing $P_i$ in which each literal of $P_i$ must be asserted to pass the input variable $V_i$ to the output. The notation used to describe the output, F, of the pass network shown in FIG. 3 is of the following form.

$$F = \sum_{i=1}^{n} p_i(v_i)$$

When all the literals in $P_i$ are asserted then the input variable, $V_i$, is passed to the output, F. If $V_i$ is the pass variable passed by $P_i$, then $P_i(V_i)$ denotes the pass implicant.

To simplify description of the inventive pass transistor asynchronous sequential circuit design method, it will also be helpful to summarize the relevant conventional asynchronous sequential circuit terminology.

An asynchronous sequential circuit is defined in terms of input, internal and output states. The input states are applied from external sources, the internal state is contained within the required memory function of the circuit and the output state is presented to the external environment. The activity of an asynchronous sequential circuit is often defined in terms of a flow table, such as Table 2 set forth below:

TABLE 2

|   | $I_1$ | $I_2$ | $I_3$ | $I_4$ | $y_1$ | $y_2$ | $y_3$ |
|---|---|---|---|---|---|---|---|
| A | A | B | D | — | 0 | 0 | 0 |
| B | A | B | C | B | 0 | 1 | 1 |
| C | A | C | C | B | 1 | 1 | 1 |
| D | D | C | D | — | 1 | 0 | 0 |

The internal states are encoded with state variables, $y_i$ (so that, for example, in Table 2, internal state A is the internal state in which $y_1=0$, and $y_3=0$). The input states are noted as $I_i$. The entries of the flow table columns headed by input state $I_i$ are the next state variables, $Y_i$, and the output state variables, $Z_i$. Although the output states $Z_i$ are omitted from the entries of Table 2, it should be understood that each entry in the first four columns of Table 2 corresponds not only to an input state ($I_i$), a present internal state (A, B, C, or D), and a next internal state (A, B, C, or D), but also to one of output state variables $Z_i$.

The circuit's "present state" is a set of boolean values representing the current values of the internal state variables. For a circuit with n state variables, the set of present state variables will be represented by $y=[y_1, y_2, \ldots y_n]$. For a circuit with four state variables, the set of state variables will be represented by $y=[y_1, y_2, y_3, y_4]$. The internal state would be represented by the boolean value of each state variable. The internal state might be 0110 implying $y_1=0$ $y_2=1$ $y_3=1$ $y_4=0$.

The circuit's "next state" is a set of boolean values representing the new state that the internal state variables will assume under a given condition of the inputs. For a circuit with n state variables, the set of next states will be represented by $Y=[Y_1, Y_2, \ldots Y_n]$.

The "total circuit state" of a sequential circuit is the internal state plus the input state. If $[S_i]$ represents the set of present state variables and $[I_p]$ represents the set of input states then the total circuit state is represented by $(S_i, I_p)$. For example, $(A, I_1)$ denotes the stable total circuit state in the first column of Table 2.

The design equations of a sequential circuit consist of equations for the next state variables, $Y_i$, and the output state variables, $Z_i$. These equations are a function of the internal state variables.

A sequential circuit is in a "stable" state when the next state and the present state are equal; all other specified states are "unstable." The upper left entry in Table 2 thus represents a stable state. A sequential circuit will remain in a stable state until another input is applied to the circuit to cause a transition to a new state. If unstable state $S_j$ transitions to stable state $S_i$, $(S_j, S_i)$ is called a "transition pair." The collection of the unstable states under a given input variable with the same next state entry together with the stable state are called a "k-set." In Table 2 under input $I_1$, there are transition pairs (A,B) and (A,C) in K-set ABC.

A "transition path" is the sequence of potential states that the circuit could assume during a transition between unstable and stable states. For example, in Table 2, where A is encoded 000 and B is encoded 011 by state variables $y_1$, $y_2$, $y_3$, the transition path between state B and state A would be 0—(i.e., all states where $y_1=0$). For the flow table shown in Table 2, the transition from state C to state D has two potential transition paths, 111 → 110 → 100 or 111 → 101 → 100. The specific path taken depends on circuit delays.

A "hazard" is a potentially incorrect transition of an output caused by differences in delay through combinational logic paths. Hazards can cause a circuit to malfunction even though a state assignment has been carefully chosen to avoid race conditions. There are several different hazards that may cause a malfunction, but collectively hazards resulting from delays through combinational logic are known as combinational hazards.

A "static" hazard occurs when a circuit output experiences a transition when that output should have remained constant. A "static one" hazard appears as a 1 → 0 → 1 transition on a node that should have remained a "1". A static zero hazard appears as a 0 → 1 → 0 transition on a node that should have remained a "0". Static hazards potentially exist when there are two paths to the output of a combinational logic network triggered by the same input change.

A "dynamic" hazard occurs when a variable experiences multiple transistions when only one transition should have occurred. Dynamic hazards occur when there are three or more paths to an output from a single input or it's inverse.

An "essential" hazard occurs because of excessive delay in circuit with two or more variables resulting in transition to an incorrect state as a result of an input change. An essential hazard can occur when a signal and it's inverse are both required by a sequential circuit. If the signals, due to delays, are at the same logic level for a sufficiently long time, the circuit can transition to an erroneous state regardless of whether the state assignment is critical race free.

"Races" occur whenever more than one internal state variable is excited at the same time. The fastest circuit operation can be achieved when all state variables that are to transition are excited simultaneously. This generates many race conditions.

A "critical race" occurs if the successor state is dependent on circuit delays. If transition paths lead to two distinct stable states depending on which state variable wins the race, the circuit will malfunction if the wrong stable state is reached. A race is "noncritical" if the successor state is not dependent on circuit delays. If both transition paths are through unstable states headed towards the same stable state, then the circuit will arrive safely at the correct stable state regardless of which state variable wins the noncritical race.

An important step in designing a sequential circuit is the binary coding of the circuit's internal states. This coding step is known as the "state assignment" operation, and the code for the internal states is known as the "state assignment." A "unit distance" state assignment allows only one state variable at a time to change between an unstable state and the stable state of a k-set. If all states between which a circuit may transition are logically adjacent, then all race conditions are eliminated. This is not always possible to achieve for a given flow table. A "one-hot-code" state assignment is a 1-out-of-n code where only a single state variable is asserted for each stable state. In a "single transition time" (SST) state assignment, the state variables that are to change state are all simultaneously excited at the start of the transition.

There are several STT state assignments which are critical race free. These were developed by Tracey in "Internal State Assignments for Asynchronous Sequential Machines," IEEE Trans. on Electronic Computers, V. EC-15, No. 4, pp. 551–560 (August 1966), Liu in "A State Variable Assignment Method for Asynchronous Sequential Switching Circuits," J.A.C.M., Vol. 10, pp. 209–216 (April 1963) and Tan in "State Assignments for Asynchronous Sequential Machines," IEEE Trans. on Computers, V. C-20, No. 4, pp. 382–391 (April 1971). A Tracey state assignment partitions each transition pair from all other transition pairs under each input. A Liu assignment partitions k-sets under each input. A Tan assignment is a Liu assignment with the provision that only one state variable is required to partition a transition path (k-set).

Until the present invention, it was not known how to efficiently design and construct asynchronous sequential circuits employing pass transistor networks. The inventive method is capable of designing a pass transistor asynchronous sequential circuit to implement any of a broad class of logical functions using minimal or near minimal hardware. The several embodiments of the inventive method disclosed herein are easier to use than conventional asynchronous sequential circuit design techniques. Pass transistor implementations that result from performance of the invention have greatly reduced transistor counts and the design equations are related directly to the structure of the flow table. This relationship between the flow table and the circuit is evident in both the design equations and many of the logical implementations. Standard state assignments are employed in performing the invention. Partition algebra is applied to produce design equations which are written by inspection. The invention results in critical race free circuits exhibiting increased freedom from essential and functional hazards associated with inputs.

SUMMARY OF THE INVENTION

The invention is a method for designing and constructing pass transistor asynchronous sequential circuits, and a class of pass transistor asynchronous sequential circuits designed in accordance with the inventive method. The inventive circuit design method generates a design for each next state vriable, $Y_i$, of an asynchronous pass transistor circuit, where each design corresponds to a portion of the circuit.

In a first preferred embodiment, each design has form $$Y_i = \sum_{j=1}^{1} \sum_{k=1}^{m_j} p_k I_j(x_{kj}),$$

where $p_k I_j(x)$ represents a pass transistor path which decodes a transition path to stable state $S_k$ under input signal $I_j$, where bit $x_{kj}$ is the jth bit of state $S_k$ ($x_{kj}$ is equal to zero or one), ech $p_k$ is a partition of the circuit's present state variables under input signal $I_j$, 1 is the number of input signals to the circuit, and $m_j$ is the number of partitions under input $I_j$. This first preferred embodiments results in an asynchronous circuit design comprising a pass transistor network and a buffer (having no long term memory) for receiving the output of the pass transistor network. In this embodiment, the inventive design method includes the steps of: generating a flow table indicative of the desired circuit characteristics, and encoding the flow table with a state assignment; generating each partition $p_k$ of the circuit's internal states under each input variable $I_j$ of the flow table (each such partition will be associated with a stable state of the circuit); for each state variable index i, if the ith bit in the stable state of $p_k$ is equal to one, including the term $p_j I_k(1)$ in the design for next state variable $Y_i$, and if the ith bit in the stable state of $p_k$ is zero, including the term $p_j I_k(0)$ in the design for $Y_i$; and generating a product expression corresponding to each partition $p_k$ by producing a covering by each partition $p_k$ of the transition path to the stable state of each partition $p_k$, and substituting the product expressions for the corresponding partitions $p_k$ in the designs for variables $Y_i$. The circuit will be critical race free if the state assignment is a single transition time (STT) state assignment.

The first embodiment (and the second embodiment, to be described below) of the invention results in circuits comprising pass transistor networks that are identical in structure for each next state variable $Y_i$ (although different sets of constant input signals are applied to each network). It is within the scope of the invention to design and construct circuits having this architecture in accordance with a structured layout including an input section, a logic section implementing the next state functions, a buffer section, and a feedback section. The logic section preferably includes a pass transistor matrix programmed with either a diffusion-contact-metal transistor structure or a metal jumper structure. The feedback lines preferably are metal lines that are programmed by making contact with the gate lines feeding the pass transistors. The input section has constant input signals $V_{dd}$ and $V_{ss}$ running throughout, and is thus programmed to present zeros and ones to the logic section.

In a second preferred embodiment, the inventive method results in a critical race free, asynchronous circuit design comprising an enable pass transistor network, a disable pass transistor network, and a buffer (including a memory unit) for receiving the output of both pass transistor networks. In this embodiment, the inventive design method includes the steps of: (a) generating a flow table indicative of the desired circuit characteristics, and encoding the flow table with a single transition time (STT) state assignment; (b) generating each partition $p_k$ of the circuit's internal states under each input signal $I_j$ of the flow table (each such partition will be associated with a stable state of the circuit and will include a block corresponding to a transition pair or k-set of the stable state); (c) for each state variable index i, each partition $p_k$, and each input $I_j$ if the partition $p_k$ has a block corresponding to a transition path in which present state variable $y_i$ transitions from 0 to 1, including the term $p_j I_k(1)$ in the design for variable $Y_i$, and if the partition has a block corresponding to a transition path in which $y_i$ transitions from 1 to 0, including the term $p_j I_k(0)$ in the design for variable $Y_i$; and (d) generating a product expression corresponding to each partition $p_k$ by producing a covering by each partition $p_k$, of the transition path to the partition's stable state, and substituting the product expressions for the corresponding terms $p_k$ in the designs for variables $Y_i$. In this case, the $p_k I_j(1)$ terms form the enable network design of the circuit, while the $p_k I_j(0)$ terms form the disable network design.

In an important variation on the second embodiment, the asynchronous sequential circuit's buffer is a latching buffer.

In a third preferred embodiment, just as in the second preferred embodiment, the inventive method results in a critical race free, asynchronous circuit comprising an enable pass transistor network, a disable pass transistor network, and a buffer (including a memory unit) for receiving the output of both pass transistor networks. Steps (b) and (c) of the third embodiment are identical to steps (b) and (c) of the second embodiment. Step (a) of the third embodiment differs from step (a) of the second embodiment in that the state assignment for the flow table need not be an SST assignment. Step (d) of the third embodiment differs from step (d) of the second embodiment only in that the entire transition path is not covered. Instead, only the portion of the transition path containing an unstable state (i.e., the portion where state variable bit $y_i$ experiences a 0 to 1 transition or a 1 to 0 transition) is covered.

In a fourth embodiment (which is an important special case of the third embodiment), a one-hot-code state assignment is employed in step (a). In a preferred version of this fourth embodiment, the circuit is constrained to operate in a "non-normal" mode in which only one state variable is allowed to change at a time. In another preferred version of this fourth embodiment, the circuit operates in a "non-normal" mode in which two nonsimultaneous state variable changes are required for each state transition. This latter version of the fourth embodiment includes the steps of: (a) generating a flow table indicative of the desired circuit characteristics, and encoding the flow table with a one-hot-code state assignment; (b) for each internal state $S_i$ (of the flow table) that is stable under input variable $I_j$, and for each state transition from unstable state $S_k$ to state $S_i$, including the enable term $y_k I_j(1)$ in the design for next state variable $Y_i$; and (c) for ech internal state $S_i$ (of the flow table) that is unstable under input variable $I_j$ with an associated state variable $Y_i=1$, for each state transition from state $S_i$ to state $S_j$, including the disable term $y_i Y_j(0)$ in the design for next state variable $Y_i$. In a variatin on step (c) of this method, the disable term $y_i y_k I_m(0)$ is included in the next state expression for each state transition from state $S_i$ to state $S_k$ caused by input variable $I_m$ (rather than the disable term $y_i y_j(0)$ set forth in the previous sentence), introducing a handshake.

Asynchronous sequential pass transistor circuits constructed according to a design determined by any of the inventive method embodiments are also within the scope of the invention.

BRIEF DESCRIPTION OF THE DRAWINGS

FIG. 1 is a diagram representing a single pass transistor.

FIG. 2 is a diagram representing a pass transistor network.

FIG. 3 is another diagram representing a pass transistor network.

FIG. 4 is a circuit diagram of a circuit designed in accordance with a first preferred embodiment of the inventive method.

FIG. 5 is a circuit diagram of a pass transistor network, corresponding to a next state variable $Y_i$, designed in accordance with the first preferred embodiment of the inventive method.

FIG. 16 is a circuit layout diagram including the FIG. 15 circuitry, as well as additional circuitry.

DETAILED DESCRIPTION OF THE PREFERRED EMBODIMENTS

Figure 6:
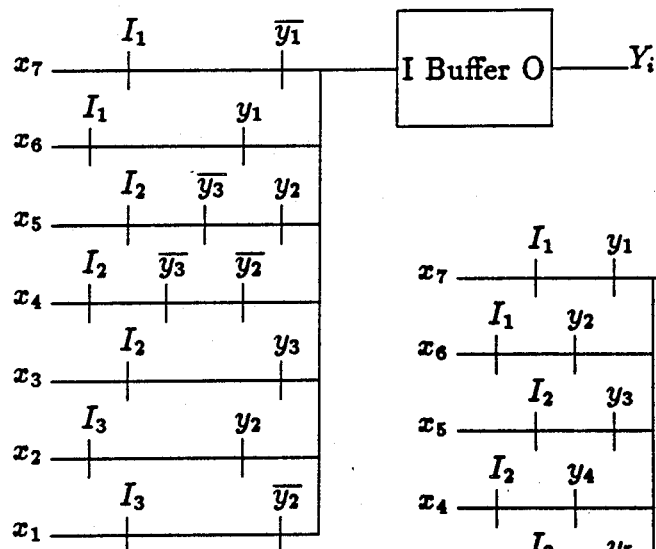
FIG. 6 is a circuit diagram of a pass transistor network, corresponding to a next state variable $Y_i$, designed in accordance with the first preferred embodiment of the inventive method.

A first preferred embodiment of the invention will be described with reference to FIG. 4. To avoid ambiguity in the description of this and the other embodiments, it will be helpful initially to define the terms "partition" and "cover" that will be employed in the description.

A "partition" p on a set S is a collection of subsets of S such that their pairwise intersection is the null set. Each such subset is called a "block." A "T-partition" is a partition consisting of two blocks.

The pass transistor architecture resulting from performance of the first preferred embodiment is depicted in FIG. 4. FIG. 4 is an asynchronous sequential circuit including a pass transistor network 1, and a buffer 2 for receiving the output of network 1. In general, the inventive circuit design includes a number of circuits identical to that shown in FIG. 4, one circuit for each next state variable $Y_i$. Each transistor pass network 1 covers one of the next state expressions $Y_i$ in each transition path. Since buffer 2 has no long-term memory, and since the circuit output must be defined under all input conditions, buffer 2 must be driven under every input condition.

The FIG. 4 circuit is driven by n variable input signals as well as constant input signals representing logical zeros or ones (in other words, the set of input signals to the FIG. 4 circuit is $I=[I_1, I_2, \ldots, I_n, 0, 1]$).

The m present state variables $y_i$ of network 1, $y=[y_1, y_2, \ldots, y_m]$, allow network 1 to assume as many as $2^m$ unique states. The internal state of network 1 may be described by an m-tuple consisting of each present state variable. We shall define S as the set of m-tuples which defines the specified states of network 1. For a circuit with $q \leq 2^m$ internal states, $$S = [S_1, S_2, \ldots, S_q]$$

The inventive circuit requires that buffer 2 follow each pass transistor network 1. Buffer 2 is preferably a double inverter buffer including transistor Q1 and inverters IC1 and IC2 as shown in FIG. 4, so that it isolates the pass network output from the potentially large capacitance seen by the state variable. This optimizes the speed of pass transistor network 1. If network 1 is an NMOS pass transistor network, transistor Q1 is a weak PMOS feedback transistor to overcome the effects of threshold voltage which degrades the NMOS pass network output high-level, and also to reduce the power required by buffer 2 to essentially zero between transitions. When the output of pass network 1 is recognized as a logical one level by first inverter IC1, the output of first inverter IC1 transitions low turning PMOS feedback transistor Q1 and pulls the output of pass transistor network 1 to the high level supply rail. Feedback transistor Q1 must be weak so that the series path through pass network 1 and the pull down path of the source of the pass variable will be able to pull the output of pass network 1 below the switching threshold of first inverter IC1.

Given a reduced flow table (to be described below), the first step in the first embodiment of the inventive design method is to generate a critical race free state assignment. Critical race conditions are avoided by employing state assignments in which transition paths between states are disjoint. The state assignments set forth in the above-referenced papers by Tracey, Liu and Tan are examples of state assignments where the transition paths do not intersect. These disjoint state assignments are known as "single transition time" (STT) state assignments.

Consider next the flow table set forth in Table 3:

TABLE 3

|   | $I_1$ | $I_2$ | $I_3$ | $y_1$ | $y_2$ | $y_3$ | $y_4$ |
|---|---|---|---|---|---|---|---|
| A | A | F | E | 0 | 0 | 0 | 0 |
| B | A | B | D | 0 | 1 | 1 | 0 |
| C | A | C | D | 1 | 1 | 0 | 0 |
| D | D | B | D | 1 | 1 | 1 | 1 |
| E | D | C | E | 1 | 0 | 0 | 1 |
| F | D | F | E | 1 | 0 | 1 | 0 |

The flow table has been given a state assignment which is critical race free due to the disjoint nature of the transition paths. The k-sets of the Table 3 flow table consist of all next state entries in each column of the flow table that lead to the same stable state. For example, in column $I_1$ of Table 3, the k-sets are ABC and DEF. The internal state assignment of Table 3 is the encoding of the states of the flow table by the state variables $y_1, y_2, y_3, y_4$, so that, for example, state B is encoded by $y_1=0, y_2=1, y_3=1$, and $y_4=0$. An example of a "T-partition" (a two block partition) over column $I_1$ of Table 3 is a partition in which the first block consists of the states that are encoded by 1 by $y_1$ and the second block are encoded by 0 by $y_1$, namely $t_1=\text{CDEF;AB}$ in Table 3. A transition path for the circuit determined by Table 3 consists of all states that the circuit could assume in transitioning between an unstable state and a stable state (each such pair of states is known as a "transition pair"). The transition pairs for the k-set ABC column $I_1$ are AB and AC. In Tracey's state assignment algorithm, state variables are generated so as to partition transition paths under each input; and the state variables that perform the partitioning under input $I_p$ are called the partitioning variables of $I_p$.

We shall let $T[S_i,S_j]$ denote a covering for a transition path from state $S_i$ to stable state $S_j$. For $I_1$ in Table 3, there are four possible transitions. These four transitions can be covered by the transition paths $T[S_b,S_a]$, $T[S_c,S_a]$, $T[S_e,S_d]$ and $T[S_f,S_d]$.

We shall let $p_k$ denote a partition that partitions states of set S from all other states under input $I_k$ of a flow table. The states of S will represent all the states of a transition path associated with S. This could be the elements of a transition pair or a k-set, depending on the circuit and the state assignment. For example $p=\text{AF;BCDE}$ is a partition under $I_2$ of Table 3, where AF is a k-set under $I_2$. Partition p represents a path in the circuitry that forms a next state variable $Y_i$.

Several key concepts apply to the description of all embodiments of the invention: The set S is dependent on the state assignment method (if the state assignment is a Tracey assignment, S consists of transition pairs under input $I_p$, and if the state assignment is a Liu assignment, then S consists of k-sets under input $I_p$); and partition $P_k$ can be expressed as a product of the partitioning variables of $I_k$.

For example, consider a flow table with 3 k-sets consisting of states ABC, DE, and FG respectively under input $I_k$. Let $p_{abc}=\text{ABC;DEFG}$. Moreover, let T-partition $t_1=\text{ABCDE;FG}$, T-partition $t_2=\text{AFD;BCGE}$, and T-partition $t_3=\text{DE;ABCFG}$. The state variable product expression covering $p_{abc}$ is then $y_1 \overline{y_3}$. The path realizing $p_{abc}$ would thus consist of two series transistors, one controlled by variable $y_1$ and the other by variable $\overline{y_3}$. The flow table and partition variables are shown in Table 4:

TABLE 4

| | $I_p$ | $y_1$ | $y_2$ | $y_3$ |
|---|---|---|---|---|
| A | A | 1 | 1 | 0 |
| B | A | 1 | 0 | 0 |
| C | A | 1 | 0 | 0 |
| D | D | 1 | 1 | 1 |
| E | D | 1 | 0 | 1 |
| F | F | 0 | 1 | 0 |
| G | F | 0 | 0 | 0 |

We shall let $P_k I_j(x_{kj})$ denote a pass transistor path decoding the transition path from a state $S_i$ to a stable state $S_k$ under input signal $I_j$ where $x_{kj}$ is the jth bit of the encoded version of state $S_k$, and $x_{kj}\delta[0,1]$.

The general form of the design equations for transition path state assignments produced in the first embodiment of the inventive method is a summation of partitions qualifying input variables passing an appropriate logic state, of the following form:

$$Y_i = \sum_{j=1}^{1} \sum_{k=1}^{m_j} p_k I_j(x_{kj}) \quad (1)$$

where $x_{kj}\epsilon[0,1]$, each $p_k$ is a partition of the present state variables under input $I_j$, 1 is the number of input signals and $m_j$ is the number of partitions under input $I_j$.

Referring again to the Table 3 flow table, for each stable state $S_j$ there is an associated transition pair $T[S_i,S_j]$ through which the circuit may traverse under the influence of an input signal, $I_k$. Each transition pair can be partitioned from unrelated transition pairs by sets of partitioning variables. The inventive design procedure takes advantage of this partition algebra.

The invention generates a design for a pass transistor network for each next state variable, $Y_i$, of an asynchronous sequential circuit in a manner so that the design has the form set forth in Equation (1).

The first embodiment of the inventive method includes the following steps:

1. Generate a flow table expressing the desired circuit characteristics, and encode the flow table with an STT state assignment;
2. Generate each partition, $p_k$, under each input signal, $I_j$, of the flow table;
3. For each state variable $y_i$, and hence each state variable index i,
    (a) If $y_i=1$ in the stable state of $p_k$ then $p_kI_j(1)$ is included in the design for $Y_i$, and
    (b) If $y_i=0$ in the stable state of $p_k$ then $p_kI_j(0)$ is included in the design for $Y_i$; and
4. Generate a state variable product expression for each partition $p_{kj}$ by producing a covering for each partition $p_k$ of the transition path to the stable state of said partition $p_k$, and substitute to derive the designs for next state variables $Y_i$.

We next demonstrate that this method properly generates the designs for the next state variables. There are two items that must be demonstrated to prove that the inventive design procedure generates a critical race free STT realization. First, it must be demonstrated that all transition paths are partitioned in accordance with Tracey's Theorem (set forth in the referenced paper by Tracey) and second, it must be demonstrated that the next state entries of the transition paths produce STT action. The first step in the inventive procedure is to encode the flow table with a critical race free assignment that satisfies Tracey's Theorem. STT action is guaranteed whenever all states of the transition paths have the same next state entry. That is, the next state variables for each state in the transition path must be the same. Step 3a and step 3b specify that the next state entries for $Y_i$ are determined solely by the code induced by the stable state under $p_k$, therefore all states of the transition path are encoded the same way, namely with the code for the stable state. This is precisely the proper value for STT operation.

Furthermore, asynchronous sequential circuits designed and constructed in accord with the first embodiment will tolerate zero-zero (0—0) cross over on the inputs. This can be readily understood by considering an arbitrary $p_sI_o(x)$ circuit which consists of a series of string of NMOS pass transistors. When $I_p=0$, the output of the pass network is in a high impedance state. For 0—0 cross over, all inputs are low causing all buffer inputs to be presented with a high impedance. A high impedance input driving buffer network 2 shown in FIG. 4 causes no change in state since the state information is stored in the form of charge on the gate of first inverter IC1 in the buffer and circuit operation is unaffected. The inputs may thus freely have 0—0 cross over. The duration of the cross over is limited only by leakage on the dynamic storage of buffer circuit 2.

Critical race free state assignments of the type described, respectively, in Tracey, Liu, and Tan will now be considered and the resulting circuit designs will be compared. A Tracey assignment can produce the minimum number of present state variables $y_i$ needed to encode a given flow table, but at the expense of potentially requiring more than one transition path per k-set. A Liu assignment aften requires more variables, but it has the feature of producing only one transition path per k-set. If the resulting pass transistor circuit is a strong function of the number of variables, a Tracey assignment will be best, but if the architecture is a strong function of the number of transition paths, then a Liu assignment would be best. A Tan assignment is a Liu assignment with the provision that only one state variable is required to partition a transition path (k-set). If the transistor architecture has a set of pass networks that are a strong function of the number of state variables (ideally only one) and the number of pass networks is not a major concern, then a Tan assignment will be best.

As a first example of the first inventive embodiment, we employ the first embodiment to design pass networks for the asynchronous sequential circuit described by the flow table of Table 3, with the Tracey state assignment given in Table 3.

The first step is to establish the Tracey state assignment. Such an assignment is shown in Table 3. Under input $I_1$, there are four transition pairs that must be partitioned, namely, $T[S_b,S_a]$, $T[S_c,S_a]$, $T[S_e,S_d]$ and $T[S_f,S_d]$. Transition pairs can be likewise identified under inputs $I_2$ and $I_3$ generating the following partitions:

$p_{ba}$ = BA;DEF
$p_{ca}$ = CA;DEF
$p_{ed}$ = ED;ABC
$p_{fd}$ = FD;ABC
$p_{af}$ = FA;BCDE
$p_{db}$ = DB;ACEF
$p_{ec}$ = EC;ABDF
$p_{bd}$ = BD;AEF
$p_{cd}$ = CD;AEF

-continued

| | |
|---|---|
| $p_{ae}$ = | AE;BCD |
| $p_{fe}$ = | FE;BCD |

The general design for each of the next state variables consists of a term for each partition:

$$Y_i = p_{ba}I_1() + p_{ca}I_1() + p_{ed}I_1() + p_{fd}I_1() +$$
$$p_{af}I_2() + p_{db}I_2() + p_{ec}I_2() +$$
$$p_{bd}I_3() + p_{cd}I_3() + p_{ae}I_3() + p_{fe}I_3()$$

The next step is to enter $p_k I_j(1)$ for the destination state under $p_k$ that has $y_i = 1$. For $p_{ba}$ and $p_{ca}$, the destination state is $S_a$ which has no state variables asserted. For $p_{ed}$ and $p_{fd}$, the destination state $S_d$ requires all of the state variables to be asserted. State variables $y_1$ and $y_3$ are high in state $S_f$ which is the destination state under $p_{af}$ while $y_2$ and $y_3$ are high in state $S_b$ for $p_{db}$. $S_c$, the destination state under $p_{ec}$ requires that $y_1 = 1$ and $y_2 = 1$. The partitions $p_{bd}$ and $p_{cd}$ have all the state variables high under $S_d$, while $y_1$ and $y_4$ are high under state $S_e$ in $p_{ae}$ and $p_{fe}$.

$$Y_1 = p_{ba}I_1() + p_{ca}I_1() + p_{ed}I_1(1) + p_{fd}I_1(1) +$$
$$p_{af}I_2(1) + p_{db}I_2() + p_{ec}I_2(1) +$$
$$p_{bd}I_3(1) + p_{cd}I_3(1) + p_{ae}I_3(1) + p_{fe}I_3(1)$$

$$Y_2 = p_{ba}I_1() + p_{ca}I_1() + p_{ed}I_1(1) + p_{fd}I_1(1) +$$
$$p_{af}I_2() + p_{db}I_2(1) + p_{ec}I_2(1) +$$
$$p_{bd}I_3(1) + p_{cd}I_3(1) + p_{ae}I_3() + p_{fe}I_3()$$

$$Y_3 = p_{ba}I_1() + p_{ca}I_1() + p_{ed}I_1(1) + p_{fd}I_1(1) +$$
$$p_{af}I_2(1) + p_{db}I_2(1) + p_{ec}I_2() +$$
$$p_{bd}I_3(1) + p_{cd}I_3(1) + p_{ae}I_3() + p_{fe}I_3()$$

$$Y_4 = p_{ba}I_1() + p_{ca}I_1() + p_{ed}I_1(1) + p_{fd}I_1(1) +$$
$$p_{af}I_2() + p_{db}I_2() + p_{ec}I_2() +$$
$$p_{bd}I_3(1) + p_{cd}I_3(1) + p_{ae}I_3(1) + p_{fe}I_3(1)$$

The second half of the third step requires the remaining pass variables to be 0 since the remaining variables in the stable states under $p_j$ have $y_i = 0$.

$$Y_1 = p_{ba}I_1(0) + p_{ca}I_1(0) + p_{ed}I_1(1) + p_{fd}I_1(1) +$$
$$p_{af}I_2(1) + p_{db}I_2(0) + p_{ec}I_2(1) +$$
$$p_{bd}I_3(1) + p_{cd}I_3(1) + p_{ae}I_3(1) + p_{fe}I_3(1)$$

$$Y_2 = p_{ba}I_1(0) + p_{ca}I_1(0) + p_{ed}I_1(1) + p_{fd}I_1(1) +$$
$$p_{af}I_2(0) + p_{db}I_2(1) + p_{ec}I_2(1) +$$
$$p_{bd}I_3(1) + p_{cd}I_3(1) + p_{ae}I_3(0) + p_{fe}I_3(0)$$

$$Y_3 = p_{ba}I_1(0) + p_{ca}I_1(0) + p_{ed}I_1(1) + p_{fd}I_1(1) +$$
$$p_{af}I_2(1) + p_{db}I_2(1) + p_{ec}I_2(0) +$$
$$p_{bd}I_3(1) + p_{cd}I_3(1) + p_{ae}I_3(0) + p_{fe}I_3(0)$$

$$Y_4 = p_{ba}I_1(0) + p_{ca}I_1(0) + p_{ed}I_1(1) + p_{fd}I_1(1) +$$
$$p_{af}I_2(0) + p_{db}I_2(0) + p_{ec}I_2(0) +$$
$$p_{bd}I_3(1) + p_{cd}I_3(1) + p_{ae}I_3(1) + p_{fe}I_2(1)$$

The operation of the circuit can be understood by observing the function of the terms in the design equations. The transition from $S_a \rightarrow S_f$ occurs when $I_2 \rightarrow 1$. The fifth terms in the next state equations for the next state variables $y_1$ and $y_3$, cause 1's to be passed when $I_2 \rightarrow 1$ and the circuit is in state $S_a$. This moves the circuit from state 0000 to 1010. This same decode maintains the state variables at 1010 while $I_2$ remains asserted. The first term of the design equations allows the state variables to monitor $I_1$ when in state $S_b$. When $I_1 \rightarrow 1$, then $y_2 \rightarrow 0$ along with $y_3$ while $y_1$ and $y_4$ remain at a 0. Again, the first term maintains the state 0000 while $I_1$ is asserted in $S_a$.

To complete the procedure, it is necessary to construct the decode circuits for each of the partitions. A covering of these partitions results in the following decode equations:

| | |
|---|---|
| $p_{ba}$ = | $\overline{y_1}\,\overline{y_4}$ |
| $p_{ca}$ = | $\overline{y_3}\,\overline{y_4}$ |
| $p_{ed}$ = | $y_1\,y_4$ |
| $p_{fd}$ = | $y_1\,y_3$ |
| $p_{af}$ = | $\overline{y_2}\,\overline{y_4}$ |
| $p_{db}$ = | $y_2\,y_3$ |
| $p_{ec}$ = | $y_1\,y_3$ |
| $p_{bd}$ = | $y_2\,y_3$ |
| $p_{cd}$ = | $y_1\,y_2$ |
| $p_{ae}$ = | $\overline{y_2}\,\overline{y_3}$ |
| $p_{fe}$ = | $y_1\,\overline{y_2}$ |

Substituting the decode equations, the next state designs become $$Y_1 = \overline{y_1}\,\overline{y_4}\,I_1(0) + \overline{y_3}\,\overline{y_4}\,I_1(0) + y_1\,y_4\,I_1(1) +$$
$$y_1\,y_3\,I_1(1) + \overline{y_2}\,\overline{y_4}\,I_2(1) + y_2\,y_3\,I_2(0) +$$
$$y_1\,\overline{y_3}\,I_2(1) + y_2\,y_3\,I_3(1) + y_1\,y_2\,I_3(1) +$$
$$\overline{y_2}\,\overline{y_3}\,I_3(1) + y_1\,\overline{y_2}\,I_3(1)$$

$$Y_2 = \overline{y_1}\,\overline{y_4}\,I_1(0) + \overline{y_3}\,\overline{y_4}\,I_1(0) + y_1\,y_4\,I_1(1) +$$
$$y_1\,y_3\,I_1(1) + \overline{y_2}\,\overline{y_4}\,I_2(0) + y_2\,y_3\,I_2(1) +$$
$$y_1\,\overline{y_3}\,I_2(1) + y_2\,y_3\,I_3(1) + y_1\,y_2\,I_3(1) +$$
$$\overline{y_2}\,\overline{y_3}\,I_3(0) + y_1\,\overline{y_2}\,I_3(0)$$

$$Y_3 = \overline{y_1}\,\overline{y_4}\,I_1(0) + \overline{y_3}\,\overline{y_4}\,I_1(0) + y_1\,y_4\,I_1(1) +$$
$$y_1\,y_3\,I_1(1) + \overline{y_2}\,\overline{y_4}\,I_2(1) + y_2\,y_3\,I_2(1) +$$
$$y_1\,\overline{y_3}\,I_2(0) + y_2\,y_3\,I_3(1) + y_1\,y_2\,I_3(1) +$$
$$\overline{y_2}\,\overline{y_3}\,I_3(0) + y_1\,\overline{y_2}\,I_3(0)$$

$$Y_4 = \overline{y_1}\,\overline{y_4}\,I_1(0) + \overline{y_3}\,\overline{y_4}\,I_1(0) + y_1\,y_4\,I_1(1) +$$
$$y_1\,y_3\,I_1(1) + \overline{y_2}\,\overline{y_4}\,I_2(0) + y_2\,y_3\,I_2(0) +$$
$$y_1\,\overline{y_3}\,I_2(0) + y_2\,y_3\,I_3(1) + y_1\,y_2\,I_3(1) +$$
$$\overline{y_2}\,\overline{y_3}\,I_3(1) + y_1\,\overline{y_2}\,I_3(1)$$

The circuit diagram of FIG. 5 shows the pass transistor logic for each next state variable $Y_i$. By observing the design equations, it is easily seen that the pass variables for each partition are simply the stable state under that partition. The logic of FIG. 5 is replicated four times and the inputs are driven by the next state information shown in Table 5 to form the total circuit diagram:

TABLE 5

|  | y1 | y2 | y3 | y4 |
|---|---|---|---|---|
| x11 | 0 | 0 | 0 | 0 |
| x10 | 0 | 0 | 0 | 0 |
| x9 | 1 | 1 | 1 | 1 |
| x8 | 1 | 1 | 1 | 1 |
| x7 | 1 | 0 | 1 | 0 |
| x6 | 0 | 1 | 1 | 0 |
| x5 | 1 | 1 | 0 | 0 |
| x4 | 1 | 1 | 1 | 1 |
| x3 | 1 | 1 | 1 | 1 |
| x2 | 1 | 0 | 0 | 1 |
| x1 | 1 | 0 | 0 | 1 |

As a second example, the same flow table (set forth as Table 3) will now be encoded with a Liu state assignment. Table 6 shows the Liu state assignment:

TABLE 6

|  | $I_1$ | $I_2$ | $I_3$ | y1 | y2 | y3 |
|---|---|---|---|---|---|---|
| A | A | F | E | 0 | 1 | 0 |
| B | A | B | D | 0 | 0 | 0 |
| C | A | C | D | 0 | 0 | 1 |
| D | D | B | D | 1 | 0 | 0 |
| E | D | C | E | 1 | 1 | 1 |
| F | D | F | E | 1 | 1 | 0 |

With the Liu assignment, the flow table can be partitioned by k-sets:

$$p_{abc} = ABC;DEF$$
$$p_{def} = DEF;ABC$$
$$p_{af} = AF;BCDE$$
$$p_{bd} = BD;ACEF$$
$$p_{ce} = CD;ABDF$$
$$p_{aef} = AEF;BCD$$
$$p_{bcd} = BCD;AEF$$

The design equations are then started by entering a term for each p partition:

$$Y_1 = p_{abc}I_1(\ ) + p_{def}I_1(\ ) + p_{af}I_2(\ ) + p_{bd}I_2(\ ) + p_{ce}I_2(\ ) + p_{aef}I_3(\ ) + p_{bcd}I_3(\ )$$

$$Y_2 = p_{abc}I_1(\ ) + p_{def}I_1(\ ) + p_{af}I_2(\ ) + p_{bd}I_2(\ ) + p_{ce}I_2 + p_{aef}I_3(\ ) + p_{bcd}I_3(\ )$$

$$Y_1 = p_{abc}I_1(\ ) = p_{def}I_1(\ ) + p_{af}I_2(\ ) + p_{bd}I_2(\ ) + p_{ce}I_2(\ ) + p_{aef}I_3(\ ) + p_{bcd}I_3(\ )$$

The next step is to enter $p_jI_k(1)$ for the stable state under $p_k$ that has $y_i=1$. For $p_{abc}$, the stable state is $S_a$ which has only state variable $y_2$ asserted. Under $p_{def}$, the stable state $S_d$ requires state variable $y_1$ to be asserted. State variables $y_1$ and $y_2$ are high in state $S_f$ which is the stable state under $p_{af}$ while no state variables are high in state $S_b$ for $p_{bd}$. $S_c$, the stable state under $p_{ce}$ requires that $y_3=1$. The partition $p_{aef}$ has all the state variables asserted high under state $S_e$ while only $y_1=1$ under $S_d$ in $p_{bcd}$. The result of this step is:

$$Y_1 = p_{abc}I_1(\ ) + p_{def}I_1(1) + p_{af}I_2(1) + p_{bd}I_2(\ ) + p_{ce}I_2(\ ) + p_{aef}I_3(1) + p_{bcd}I_3(1)$$

-continued $$Y_2 = p_{abc}I_1(1) + p_{def}I_1(\ ) + p_{af}I_2(1) + p_{bd}I_2(\ ) + p_{ce}I_2(\ ) + p_{aef}I_3(1) + p_{bcd}I_3(\ )$$

$$Y_3 = p_{abc}I_1(\ ) + p_{def}I_1(\ ) + p_{af}I_2(\ ) + p_{bd}I_2(\ ) + p_{ce}I_2(1) + p_{aef}I_3(1) + p_{bcd}I_3(\ )$$

The second half of the third step requires the remaining pass variables to be 0 since the remaining variables in the stable states under $p_k$ have $y_i=0$:

$$Y_1 = p_{abc}I_1(0) + p_{def}I_1(1) + p_{af}I_2(1) + p_{bd}I_2(0) + p_{ce}I_2(0) + p_{aef}I_3(1) + p_{bcd}I_3(1)$$

$$Y_2 = p_{abc}I_1(1) + p_{def}I_1(0) + p_{af}I_2(1) + p_{bd}I_2(0) + p_{ce}I_2(0) + p_{aef}I_3(1) + p_{bcd}I_3(0)$$

$$Y_3 = p_{abc}I_1(0) + p_{def}I_1(0) + p_{af}I_2(0) + p_{bd}I_2(0) + p_{ce}I_2(1) + p_{aef}I_3(1) + p_{bcd}I_3(0)$$

Implementation again requires decode circuits for each of the partitions. A covering of these partitions results in the following decode equations:

$$p_{abc} = \overline{y_1}$$
$$p_{def} = y_1$$
$$p_{af} = y_2\,\overline{y_3}$$
$$p_{bd} = \overline{y_2}\,\overline{y_3}$$
$$p_{cd} = y_3$$
$$p_{aef} = y_2$$
$$p_{bcd} = \overline{y_2}$$

Substituting the decode equations, the next state designs become:

$$Y_1 = \overline{y_1}I_1(0) + y_1 I_1(1) + y_2\,\overline{y_3}I_2(1) + \overline{y_2}\,\overline{y_3}I_2(0) + y_3 I_2(0) + y_2 I_3(1) + \overline{y_2} I_3(1)$$

$$Y_2 = \overline{y_1}I_1(1) + y_1 I_1(0) + y_2\,\overline{y_3}I_2(1) + \overline{y_2}\,\overline{y_3}I_2(0) + y_3 I_2(0) + y_2 I_3(1) + \overline{y_2} I_3(0)$$

$$Y_3 = \overline{y_1}I_1(0) + y_1 I_1(0) + y_2\,\overline{y_3}I_2(0) + \overline{y_2}\,\overline{y_3}I_2(0) + y_3 I_2(1) + y_2 I_3(1) + \overline{y_2} I_3(0)$$

The circuit diagram of FIG. 6 shows the logic for each next state variable $Y_i$. The logic is replicated three times and the inputs are driven in accordance with the next state information shown in Table 7 to form the total circuit diagram.

TABLE 7

|  | y1 | y2 | y3 |
|---|---|---|---|
| x7 | 0 | 1 | 0 |
| x6 | 1 | 0 | 0 |
| x5 | 1 | 1 | 0 |
| x4 | 0 | 0 | 0 |
| x3 | 0 | 0 | 1 |
| x2 | 1 | 1 | 1 |
| x1 | 1 | 0 | 0 |

As a third example, the Table 3 flow table will now be encoded with a Tan state assignment. A Tan assignment is a Liu assignment, therefore the results established for a Liu assignment will again be obtained, except that, for the Tan assignment, there are more state variables (one for each k-set) and each partition is covered by a single state variable.

The first step is completed by adding a Tan state assignment to the flow table of Table 3. This is shown in Table 8:

TABLE 8

|   | $I_1$ | $I_2$ | $I_3$ | $y_1$ | $y_2$ | $y_3$ | $y_4$ | $y_5$ | $y_6$ | $y_7$ |
|---|---|---|---|---|---|---|---|---|---|---|
| A | A | F | E | 1 | 0 | 1 | 0 | 0 | 1 | 0 |
| B | A | B | D | 1 | 0 | 0 | 1 | 0 | 0 | 1 |
| C | A | C | D | 1 | 0 | 0 | 0 | 1 | 0 | 1 |
| D | D | B | D | 0 | 1 | 0 | 1 | 0 | 0 | 1 |
| E | D | C | E | 0 | 1 | 0 | 0 | 1 | 1 | 0 |
| F | D | F | E | 0 | 1 | 1 | 0 | 0 | 1 | 0 |

The partitions remain identical to those in the second example, since a Tan assignment is a particular kind of Liu assignment:

$p_{abc}$ = ABC; DEF
$p_{def}$ = DEF; ABC
$p_{af}$ = AF; BCDE
$p_{bd}$ = BD; ACEF
$p_{ce}$ = CE; ABDF
$p_{aef}$ = AEF; BCD
$p_{bcd}$ = BCD; AEF The design equations are then started by entering a term for each partition $p_k$:

$$Y_i = p_{abc}I_1() + p_{def}I_1() + p_{af}I_2() + p_{bd}I_2() + p_{ce}I_2() + p_{aef}I_3() + p_{bcd}I_3()$$

By observing the examples for Tracey and Liu state assignments, it will be recognized that the third step of the first embodiment may be replaced with a step which establishes an input variable matrix. The columns of the matrix represent the next state for each partition. Table 9 shows this matrix, in which the row $x_7$ is the next state entry for $p_{abc}$, $x_6$ for $p_{def}$, $x_5$ for $p_{af}$, $x_4$ for $p_{bd}$, $x_3$ $p_{ce}$, $x_2$ for $p_{aef}$, and $x_1$ for $p_{bcd}$.

TABLE 9

|   | $y_1$ | $y_2$ | $y_3$ | $y_4$ | $y_5$ | $y_6$ | $y_7$ |
|---|---|---|---|---|---|---|---|
| $x_7$ | 1 | 0 | 1 | 0 | 0 | 1 | 0 |
| $x_6$ | 0 | 1 | 0 | 1 | 0 | 0 | 1 |
| $x_5$ | 0 | 1 | 1 | 0 | 0 | 1 | 0 |
| $x_4$ | 1 | 0 | 0 | 1 | 0 | 0 | 1 |
| $x_3$ | 1 | 0 | 0 | 0 | 1 | 0 | 1 |
| $x_2$ | 0 | 1 | 0 | 0 | 1 | 1 | 0 |
| $x_1$ | 0 | 1 | 0 | 1 | 0 | 0 | 1 |

The pass variables can be entered into the design equations from the matrix. The first three state variables are shown in the following equations:

$$Y_1 = p_{abc}I_1(1) + p_{def}I_1(0) + p_{af}I_2(0) + p_{bd}I_2(1) + p_{ce}I_2(1) + p_{aef}I_3(0) + p_{bcd}I_3(0)$$

$$Y_2 = p_{abc}I_1(0) + p_{def}I_1(1) + p_{af}I_2(1) + p_{bd}I_2(0) + p_{ce}I_2(0) + p_{aef}I_3(1) + p_{bcd}I_3(1)$$

-continued $$Y_3 = p_{abc}I_1(1) + p_{def}I_1(0) + p_{af}I_2(1) + p_{bd}I_2(0) + p_{ce}I_2(0) + p_{aef}I_3(0) + p_{bcd}I_3(0)$$

For the Tan assignment the decode circuit is a single transistor for each of the partitions:

$p_{abc}$ = $Y_1$
$p_{def}$ = $Y_2$
$p_{af}$ = $Y_3$
$p_{bd}$ = $Y_4$
$p_{ce}$ = $Y_5$
$p_{aef}$ = $Y_6$
$p_{bcd}$ = $Y_7$ Substituting the decode equations, the next state designs become $$Y_1 = y_1I_1(1) + y_2I_1(0) + y_3I_2(0) + y_4I_2(1) + y_5I_2(1) + y_6I_3(0) + y_7I_3(0) +$$

$$Y_2 = y_1I_1(0) + y_2I_1(1) + y_3I_2(1) + y_4I_2(0) + y_5I_2(0) + y_6I_3(1) + y_7I_3(1) +$$

$$Y_3 = y_1I_1(1) + y_2I_1(0) + y_3I_2(1) + y_4I_2(0) + y_5I_2(0) + y_6I_3(0) + y_7I_3(0) +$$

$$Y_4 = y_1I_1(0) + y_2I_1(1) + y_3I_2(0) + y_4I_2(1) + y_5I_2(0) + y_6I_3(0) + y_7I_3(1) +$$

$$Y_5 = y_1I_1(0) + y_2I_1(0) + y_3I_2(0) + y_4I_2(0) + y_5I_2(1) + y_6I_3(1) + y_7I_3(0) +$$

$$Y_6 = y_1I_1(1) + y_2I_1(0) + y_3I_2(1) + y_4I_2(0) + y_5I_2(0) + y_6I_3(1) + y_7I_3(0) +$$

$$Y_7 = y_1I_1(0) + y_2I_1(1) + y_3I_2(0) + y_4I_2(1) + y_5I_2(1) + y_6I_3(0) + y_7I_3(1) +$$

Figure 7:
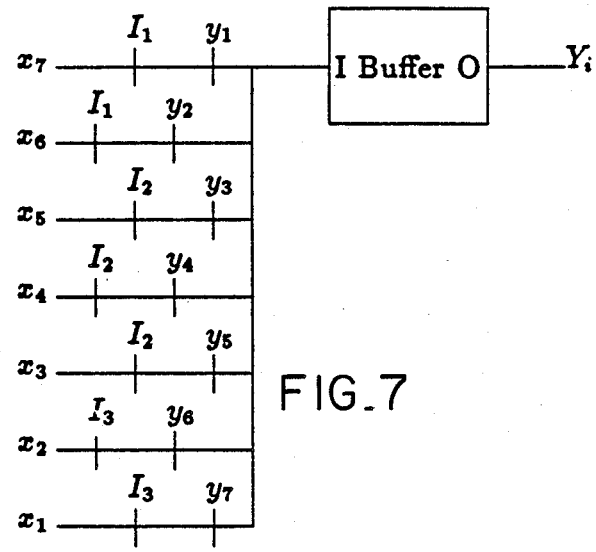
FIG. 7 is a circuit diagram of a pass transistor network, corresponding to a next state variable $Y_i$, designed in accordance with the first preferred embodiment of the inventive method.

The circuit diagram of FIG. 7 shows the logic for each next state variable $Y_i$. The logic is replicated seven times and the inputs are drived by the next state information as shown in Table 9 to form the total circuit diagram.

We shall next explain the effect of the state assignment on the number of transition paths required in the next state variable designs. Assume first a pure Tracey assignment where every transition pair is partitioned by the state assignment. The total number of $p_k$ terms in each $Y_i$ design is equal to the number transition pairs of the flow table. Let $t_{pi}$ equal the number of transition pairs in a flow table. Also let $n_{Tracey}$ equal the number of state variables required for a Tracey assignment. The number of paths, $P_{Tracey}$, required to realize the next state equations is $$P_{Tracey} = n_{Tracey} \, t_{pi}$$

For a Liu assignment, the total number of $p_k$ terms in each Yi design is equal to the number of k-sets. Let $k_i$ equal the number of k-sets in a flow table and $n_{Liu}$ equal the number of state variables required for a Liu state assignment. The number of paths required to realize the next state equation is $$P_{Liu} = n_{Liu} k_i$$

A Tan assignment is a Liu assignment, therefore, the number of paths in a Tan assignment is $$P_{Tan} = n_{Liu} k_i$$

The number of transition paths per k-set is $k-1$, for $k \geq 2$, where k is the number of states in a k-set. Then with a Tracey assignment, there are $k-1$, $p_k$ terms for each k-set. Tracey assignments thus require $k-1$ times the number of paths that Liu assignments require. Therefore, in general $$tp_i \geq k_i,$$

where equality occurs when all k-sets consist of 1 or 2 elements. In general, even though $n_{Tracey} \leq n_{Liu}$, $tp_i > k_i$ has the dominant effect on circuit complexity. The number of paths in a Liu assignment is thus normally less than that of a Tracey assignment, hence the amount of hardware required for a Liu design is expected to be less than for a Tracey design.

Consider next a column of a flow table with $2^k$ k-sets. The number of Liu variables would be k to encode an STT state assignment. However, the number of variables required in a Tan assignment would be $2^k$. Therefore, $n_{Liu} < < n_{Tan}$. Since $k_i$ is the same for both equations, the number of paths in a Liu assignment is always much less than number of paths in a Tan assignment.

The general form of the design equations for transition path state assignments was given in Equation (1). The number of transistors required to build the circuit, $T_t$, is the number of transistors required to build the pass network, $T_p$, plus the number of transistors required to build the buffer circuit, $T_b$.

The number of transistors in each $p_k$ path is equal to the number of partitioning variables in the flow table column of $p_k$ plus the number of input state variables. If the input states are completely decoded, then the number of transistors for each $p_k$ is equal to the number of partitioning variables plus 1.

If there are $tp_j$ transition paths in input column $I_j$, then the number of partition variables is $[\log_2 (tp_j)]$ in a Tracey assignment where [ ] denotes next largest integer. The number of transistors per column is $tp_j ([\log_2 (tp_j)] + 1)$. The total number of transistors is $$T_p \leq \sum_{j=1}^{1} tp_j([\log_2(tp_j)] + 1)$$

where 1 is the number of input states.

For a Liu assignment, the number of state variables to encode $k_j$ k-sets of column $I_j$ is $[\log_2 (k_j)]$. The number of transistors is then $$T_p \leq \sum_{j=1}^{1} k_j([\log_2(k_j)] + 1)$$

In a Tan assignment, the number of state variables to encode $k_j$ k-sets is $k_j$. The number of transistors per transition path is two (one for the state variables and one for the input state). Therefore the number of transistors is $$T_p \leq \sum_{j=1}^{1} 2k_j$$

The total transistor count, $T_{total}$, would be the number of state variables, n, times $T_t$:

$$T_{total} \leq nT_t$$
$$\leq n(T_p + T_b)$$

Using these equations, the total transistor count is $T_{total} \leq 152$ for the Tracey state assignment of the FIG. 5 example, $T_{total} \leq 66$ for the Liu state assignment of the FIG. 6 example, and $T_{total} \leq 133$ for the Tan state assignment of the FIG. 7 example. In general, the number of state variables, the number of k-sets and the number of transition pairs have an effect on the hardware bound.

The number of Tracey state variables is related to the total number of transition pairs, such that $n_{Tracey} \geq [\log_2 (tp_i)]$. The number of Liu state variables is related to the number of k-sets, such that $n_{Liu} \geq [\log_2 (k_i)]$. The number of transition pairs is related to the number and type of k-sets such that for $k \geq 2$, $tp = k - 1$. For flow tables dominated by k-sets with $k \geq 2$, the total hardware required for a Liu assignment will be less than that required for a Tracey assignment.

The second preferred embodiment of the inventive asynchronous sequential circuit design method (to be described initially with reference to FIG. 8), differs from the first embodiment in two respects. First, the design includes a buffer 13 having long term memory, and second, the design includes two networks of pass transistors, enable network 10 and disable network 11, which feed buffer 13. The enable and disable pass transistor networks are designed to respond to input transitions that cause the state variable to assume the opposite logic state.

Figure 8:
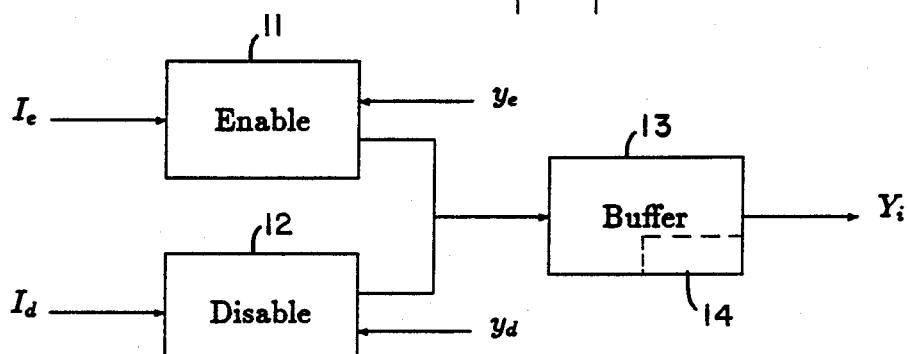
FIG. 8 is a circuit diagram of a circuit designed in accordance with a second embodiment of the inventive method.

The operation of the buffer circuit 13 of FIG. 8 is described by the state table shown as Table 10:

TABLE 10

| $y_i$ | Input | $Y_i$ |
|---|---|---|
| 0 | 0 | 0 |
| 0 | 1 | 1 |
| 1 | 0 | 0 |
| 1 | 1 | 1 |
| 0 | Z | 0 |
| 1 | Z | 1 |

The letter Z in Table 10 represents a high impedance state driving the input to the buffer. The next state $Y_i$ follows the input when the input is either a 1 or a 0, but remains such that $Y_i = Y_i$ whenever the input to the buffer is tristated (i.e., when the input to the buffer is a high impedance).

In operation of the FIG. 8 circuit, when enable and disable pass networks 11 and 12 are inactive, so that the input to buffer 13 is a high impedance, the state variable, $Y_i$, does not change. If a logic 1 is passed through enable circuit 11, then $Y_i \rightarrow 1$. If a logic 0 is passed through disable circuit 12, then $Y_i \rightarrow 0$.

An input only needs to be passed to the output, $Y_i$, by either the enable circuit or the disable circuit when a state transition is required. The disable circuit provides a path to force $1 \rightarrow 0$ transitions of the state variable. The enable circuit provides a path to force $0 \rightarrow 1$ transitions.

A state machine may be constructed from a set of circuits shown in FIG. 8, with each circuit in the set producing one next state variable, $Y_i$. The definitions set forth above with reference to FIG. 4 for inputs, I, next state variables, y, and internal states, S, are also applicable to FIG. 8.

Enable network 11 in FIG. 8 has only a single function. Enable network 11 is armed by present state information contained in $y_e \epsilon y$ to look for input $I_j$ in $I_e \subset I$, which forces a change $Y_i \rightarrow 1$. The enable circuit could be a set of pass implicants decoding each total state requiring $Y_i \rightarrow 1$. The states in which $Y_i = 0$, but whose next state also requires $Y_i = 0$, are "don't care" states for the enable network logic.

When the FIG. 8 circuit is in a state where $Y_i = 1$, disable network 12 performs a similar function. The disable network is armed by present state information contained in $y_d \subset y$ to keep $y_i = 1$ until an input $I_j$ (in $I_d \subset I$) transitions, causing the sequential machine to move to a new state requiring $y_i = 0$. The disable circuit could be a set of pass implicants decoding each total state requiring $y_i \rightarrow 0$. The states in which $y_i = 1$ but whose next state also requires $y_i = 1$, are "don't care" states for the reduced form of the disable network logic.

Figure 9:
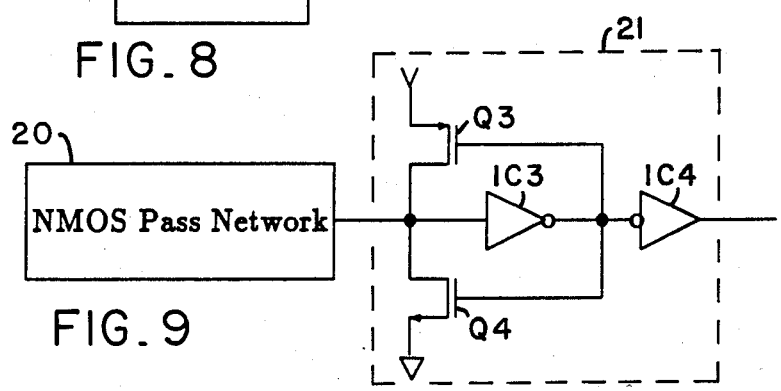
FIG. 9 is a circuit diagram of a circuit designed in accordance with a preferred variation of the second embodiment of the inventive method.

The FIG. 8 circuit is edge sensitive, so that buffer 13 must contain memory 14. FIG. 9 is a preferred version of the broad class of circuits having the form of FIG. 8. In FIG. 9, pass transistor network 20 corresponds to enable network 11 and disable network 12, and comprises NMOS pass transistors, and latching buffer 21 corresponds to buffer 13. Latching buffer 21 includes two trickle transistors (Q3 and Q4) coupled to inverters IC3 and IC4. This configuration forms a latch which NMOS pass transistor network 20 must overdrive to flip.

As in the first embodiment, critical race conditions are avoided with STT assignments (such as Tracey, Liu and Tan state assignments). We shall let "s" be the states of a transition path, and $p_s$ (under input $I_p$) partition the states of the transition path where $Y_i$ must undergo a $0 \rightarrow 1$ or $1 \rightarrow 0$ transition. If $Y_i$ contains $p_s I_p(1)$ or $p_s I_p(0)$ respectively, then we have recognized that $Y_i$ will properly specify the state transitions of $p_s$. The term $p_s I_p(x)$ where $x \epsilon [0,1]$ in the design for $Y_i$ will present the value $x$ to the input of the buffer.

The second embodiment of the inventive method includes the following steps:
1. encode the flow table for the desired circuit characteristics with an STT state assignment;
2. generate each partition, $p_k$, under each input signal, $I_j$, of the flow table;
3. determine the transitions which cause the state variables to change states;
4. for each state variable $y_i$ (hence for each index i) and each partition $p_k$,
   (a) if $p_k$ includes a block corresponding to a transition path in which $y_i$ transitions from 0 to 1, include the term $p_j I_k(1)$ in the design for $Y_i$;
   (b) if $p_k$ includes a block corresponding to a transition path in which $y_i$ transitions from 1 to 0, include the term $p_j I_k(0)$ in the design for $Y_i$; and
5. generate a state variable product expression for each partition $p_k$ by producing a covering for each partition, and substitute the state variable product expressions for the corresponding partitions in the designs for next state variables $Y_i$.

In the design for each next state variable $Y_i$, the $I_j(1)$ terms form the enable network for variable $Y_i$, while the $I_k(0)$ terms form the disable network for variable $Y_i$.

We next provide an example of the second embodiment, in which an asynchronous state machine having the flow table set forth as Table 11 is designed using a Liu state assignment.

TABLE 11

|   | $I_1$ | $I_2$ | $I_3$ | $y_1$ | $y_2$ | $y_3$ | $y_4$ |
|---|---|---|---|---|---|---|---|
| A | A | B | A | 0 | 0 | 0 | 0 |
| B | C | B | E | 1 | 0 | 0 | 1 |
| C | C | F | C | 1 | 0 | 1 | 0 |
| D | D | G | C | 1 | 1 | 0 | 0 |
| E | E | F | E | 0 | 0 | 1 | 1 |
| F | D | F | E | 1 | 1 | 1 | 1 |
| G | G | G | A | 0 | 1 | 0 | 0 |

The flow table has been given an assignment covering the following partitions under $I_1$:

| | |
|---|---|
| $p_a$ = | A;BCDEFG |
| $p_{bc}$ = | BC;ADEFG |
| $p_{df}$ = | DF;ABCEG |
| $p_e$ = | E;ABCDFG |
| $p_g$ = | G;ABCDEF |

Under $I_2$, there are three partitions:

| | |
|---|---|
| $p_{ab}$ = | AB;CDEFG |
| $p_{cef}$ = | CEF;ABDG |
| $p_{dg}$ = | DG;ABCEF |

Under $I_3$, there are also three partitions:

| | |
|---|---|
| $p_{ag}$ = | AG;BCDEF |
| $p_{bef}$ = | BEF;ACDG |
| $p_{cd}$ = | CD;ABEFG |

Table 12 contains a summary of the transitions from the flow table:

TABLE 12

| | $0 \rightarrow 1$ | Input | $1 \rightarrow 0$ | Input |
|---|---|---|---|---|
| $Y_1$ | A $\rightarrow$ B | $I_2$ | B $\rightarrow$ E | $I_3$ |
|  | E $\rightarrow$ F | $I_2$ | D $\rightarrow$ G | $I_2$ |
|  |  |  | F $\rightarrow$ E | $I_3$ |
| $Y_2$ | C $\rightarrow$ F | $I_2$ | D $\rightarrow$ C | $I_3$ |
|  | E $\rightarrow$ F | $I_2$ | F $\rightarrow$ E | $I_3$ |
|  |  |  | G $\rightarrow$ A | $I_3$ |
| $Y_3$ | B $\rightarrow$ C | $I_1$ | F $\rightarrow$ D | $I_1$ |
|  | B $\rightarrow$ E | $I_3$ |  |  |
|  | D $\rightarrow$ C | $I_3$ |  |  |
| $Y_1$ | A $\rightarrow$ B | $I_2$ | B $\rightarrow$ C | $I_1$ |
|  | C $\rightarrow$ F | $I_2$ | F $\rightarrow$ D | $I_1$ |

The enable circuits can now be formed by covering the $0 \rightarrow 1$ transitions:

$Y_1 = p_{ab}I_2(1) + p_{cef}I_2(1)$ $Y_2 = p_{cef}I_2(1)$ $Y_3 = p_{bc}I_1(1) + p_{bef}I_3(1) + p_{cd}I_3(1)$ $Y_4 = p_{ab}I_2(1) + p_{cef}I_2(1)$ The disable circuits can then be formed by decoding the transition paths causing $1 \rightarrow 0$ transitions in the state variables. The complete designs are:

$Y_1 = p_{ab}I_2(1) + p_{cef}I_2(1) + p_{bef}I_3(0) + p_{dg}I_2(0)$ $Y_2 = p_{cef}I_2(1) + p_{cd}I_3(0) + p_{bef}I_3(0) + p_{ag}I_3(0)$ $Y_3 = p_{bc}I_1(1) + p_{bef}I_3(1) + p_{cd}I_3(1) + p_{df}I_1(0)$ $Y_4 = p_{ab}I_2(1) + p_{cef}I_2(1) + p_{bc}I_1(0) + p_{df}I_1(0)$ Next the partitions are decoded (in accordance with step 5 of the second embodiment):

| | |
|---|---|
| $p_{ab}$ = | $\overline{y_2}\,\overline{y_3}$ |
| $p_{cef}$ = | $y_3$ |
| $p_{bef}$ = | $y_4$ |
| $p_{dg}$ = | $y_2\,\overline{y_3}$ |
| $p_{cd}$ = | $y_1\,\overline{y_4}$ |
| $p_{ag}$ = | $\overline{y_1}\,\overline{y_4}$ |
| $p_{bc}$ = | $y_1\,y_2$ |
| $p_{df}$ = | $y_1\,y_2$ |

Figure 10:
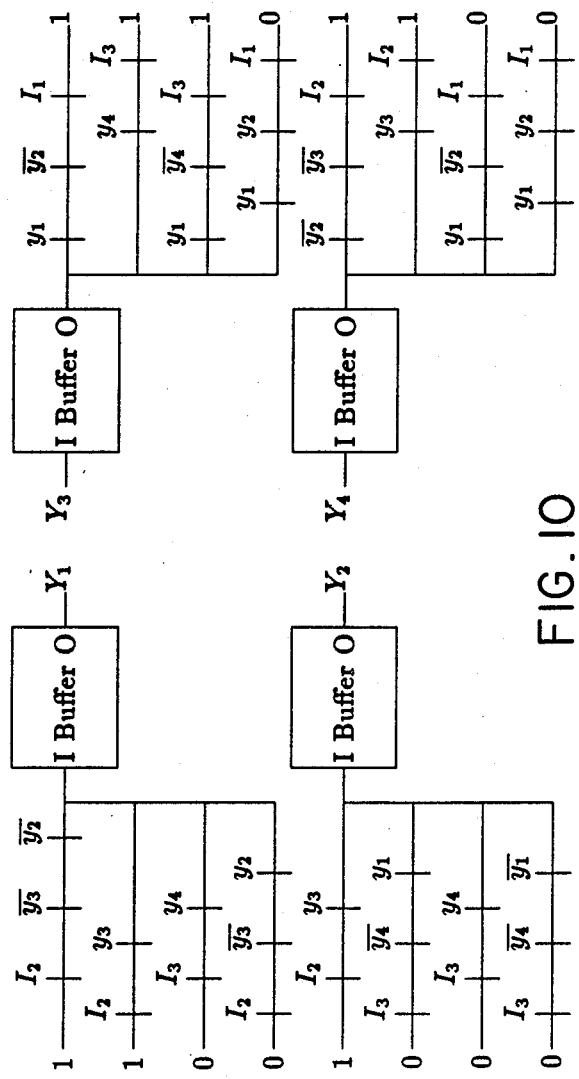
FIG. 10 is a circuit diagram of a pass transistor network, including four component pass transistor networks each corresponding to a different next state variable $Y_i$, designed in accordance with the second embodiment of the inventive method.

Substituting, the next state designs become:

$y_1 = \overline{y_2}\,\overline{y_3}\,I_2(1) + y_3 I_2(1) + y_4 I_3(0) + y_2\,\overline{y_3}\,I_2(0)$ $y_2 = y_3 I_2(1) + y_1\,\overline{y_4}\,I_3(0) + y_4 I_3(0) + \overline{y_1}\,\overline{y_4}\,I_3(0)$ $y_3 = y_1\,\overline{y_2}\,I_1(1) + y_4 I_3(1) + y_1\,\overline{y_4}\,I_3(1) + y_1 y_2 I_1(0)$ $y_4 = \overline{y_2}\,\overline{y_3}\,I_2(1) + y_3 I_2(1) + y_1\,\overline{y_2}\,I_1(0) + y_1 y_2 I_1(0)$ FIG. 10 shows the resulting circuit design, implemented with four NMOS pass transistor networks.

The second embodiment of the invention results in designs for a class of asynchronous sequential circuits which include a memory as a separate circuit from the pass transistor logic. The circuit for each next state variable is composed of three sections: first, the enable network for $y_i$ which arms the circuit to look for input changes which will cause 0→1 transitions in $y_i$; second, the disable network which arms the circuit to look for input transitions which cause $y_i$ to change from 1→0; and third, the buffer circuit which isolates the enable-disable network from the state variable load capacitance, restores the high level and provides a memory function to hold the state information when the pass network is tristated.

Circuits designed in accord with the second embodiment will have critical races if arbitrary state assignments are used, but will be critical race free if STT state assignments are used. The number of paths required in the second embodiment is reduced from that required in the first embodiment since only transitions which require the state variable to change are covered. This eliminates the need to cover all partitions $p_k$ for each state variable.

There is no cross over constraint on the inputs in the second embodiment (0—0 cross overs are allowed). The 1—1 cross over problem is solved in either of two ways. First, the flow table may be expanded to introduce columns which incorporate 1—1 cross overs. Second, 1—1 cross over may be eliminated in the input circuitry which produces the inputs to the state machine based on the primary inputs to the circuit, by including cross coupled NOR gates in the input circuitry.

A third preferred embodiment of the inventive method for designing asynchronous sequential pass transistor circuits will next be presented. The second preferred embodiment, described above, produced circuit designs which consisted of a summation of enable terms plus a summation of disable terms:

$$y_i \Sigma p_{disable} I_j(0) + \Sigma p_{enable} I_k(1) \quad (2)$$

where p was a covering for a transition path.

The whole transition path was covered for next state variable $Y_i$ by the p term. We have recognized that it is not necessary to cover the entire transition path, and that it is only necessary to cover the portion of the transition path that contains the unstable state. This recognition forms the basis for the third preferred embodiment (which third embodiment results in circuits having the design set forth in FIG. 8). If $S_u$ is the unstable state of a transition path through which the circuit must pass during a state change, then a covering of $S_u$ is sufficient to design the circuit, and the whole transition path need not be covered.

To understand the basis for the third embodiment, consider a design of the following form:

$$Y_1 = \Sigma \mu_{disable} I_j(0) + \Sigma \mu_{enable} I_k(1) \quad (3)$$

where $\mu$, is the covering of only the unstable states in the transition path where state variable $Y_i$ must experience either a 0→1 or 1→0 transition.

We have explained above that a high impedance input to buffer 13 causes the next state to equal the present state ($Y_i = y_i$). Thus, state table transitions where $Y_i$ does not change need not be covered in the design equation for $Y_i$ as long as a high impedance is presented to the buffer input. Only transitions in $Y_i$ need be effected by the enable and disable circuits. This implies that only state transitions between unstable and stable states need be accounted for in the circuit design.

If state transition $S_u \rightarrow S_s$ requires $Y_i$ to transition from 0→1 or 1→0, then $\mu_s I_p(1)$ or $\mu_s I_p(0)$ must appear in the design for $Y_i$. If the circuit begins operation in stable state $S_r$ under input signal $I_k$, then when $I_k \rightarrow 0$ and $I_p \rightarrow 1$, unstable state $S_u$ is entered and $Y_i$ must experience a 0→1 transition as the circuit subsequently changes state from $S_u$ to $S_s$. While $I_k = 1$, the term $S_u I_p(1)$ is disabled and passes a high impedance term to the buffer. Moreover, since only total circuit states that are unstable appear in the circuit design, the buffer for $Y_i$ has a high impedance input when $I_k = 1$. When the input changes to $I_p = 1$, $S_u I_p(1)$ passes a 1 to the input of $Y_i$ forcing it to a 1 state. As soon as the circuit leaves state $S_u$, term $S_u I_p(1)$ outputs a high impedance state, but $Y_i$ remains 1 to effect the transition for $y_i = 1$. Since the buffer for $Y_i$ has a high impedance input for all the states of the transition path, $y_i$ will assume the proper next state value and a critical race cannot occur.

The third embodiment of the invention may be performed to produce a circuit design in accord with Equation 3 above. The third embodiment is identical to the second preferred embodiment, except that in step 5, the state variable product expressions are generated by producing a covering by each partition $\mu_k$ of only the portion of the transition path (to the stable state of $p_k$) which contains an unstable state. In the third embodiment, a state assignment having critical races may be employed. The next state variables for the circuit are excited only when the circuit enters a total circuit state that is unstable. All other times, present and next state variables are the same and no transitions occur. In a sense, the circuit operates as a synchronous circuit, or a self synchronized circuit. State variable transitions are arbitrated by the total unstable state. Although any state assignment can be employed, the preferred embodiments described below will employ a one-hot-code as a state assignment.

Each path of a one-hot-code assignment is armed by a single state variable, like in a Tan assignment. We have recognized that use of a one-hot-code assignment provides circuit designs with low transistor counts, and facilitates a design by inspection procedure for the design equations. The following explanation provide the basis for the specific design procedures to be set forth below.

Given a flow table with states $S_0, S_1, \ldots S_n$ encoded with a one-hot-state assignment where $y_i = 1$ in state $S_i$, for each predecessor state $S_p$ of $I_k$ leading to state $S_i$, the term $\mu_{enable}I_k(1)$ is equivalent to the term $y_p I_k(1)$ in the design for $Y_i$. This is true since transition $S_p \to S_i$ is being effected when $I_k \to 1$ such that $y_i \to 1$. The total circuit state $(S_p, I_k)$ has $S_i$ as the next state entry. State $S_p$ is partitioned from all other states by $y_p = 1$. Therefore, $\mu_{enable} = y_p$.

Given a flow table with states $S_0, S_1, \ldots S_n$ encoded with a one-hot state assignment where $y_i = 1$ in state $S_i$, for each input $I_j$ where the next state $S_s$ for $S_i$ is not stable, the term $\mu_{disable}I_j(0)$ is equivalent to the term $y_i I_j(0)$ in the design for $Y_i$.

This is true since transition $S_i \to S_s$ is being effected with $I_j$ such that $y_i \to 0$. The total circuit state $(S_i, I_j)$ has $S_s$ as the next state entry. State $S_i$ is partitioned from all other states by $y_i = 1$. Therefore, $\mu_{disable} = y_i$.

For each stable state $S_i$, there is a disable path associated with each unstable state under input variable $I_j$ which will pass a 0 to the next state variable. For each stable state $S_i$, there is an enable path associated with each predecessor state which under the influence of an input variable, $I_k$, will pass a 1 to the next state variable.

A preferred variation of the above-described third embodiment of the invention can be used to design the pass networks of an asynchronous sequential circuit using a one-hot-code state assignment with the enable-disable model. This preferred variation includes the following steps:

1. For a flow table with states $S_0, S_1, \ldots S_n$, encode the table with a one-hot state assignment where $y_i = 1$ in state $S_i$.
2. Include the following terms in the design for each next state variable $Y_i$:
   (a) For each predecessor state $S_p$ of $I_k$ leading to state $S_i$, include the term $y_p I_k(1)$ in $Y_i$. This forms the enable portion of the design for $Y_i$; and
   (b) For each input $I_j$ where the next state $S_s$ is not $S_i$, include the term $Y_i I_j(0)$ in the design for $Y_i$. This forms the disable portion of the circuit design for $Y_i$.

Step 2(a) in the foregoing design procedure ensures that there is a path for each predecessor state leading into the state requiring $y_i = 1$, qualified by that predecessor state and passing a 1 under the input condition leading into that state. Step 2(b) ensures that there is a path qualified by $y_i$ and passing a 0 under the input condition leading out of the state requiring $y_i = 1$.

We next present an example of the design procedure set forth in the two preceding paragraphs. The first step is shown in the flow table Table 13. Table 13 also lists a one-hot-code state assignment for the flow table:

TABLE 13

| | $I_1$ | $I_2$ | $I_3$ | $y_1$ | $y_2$ | $y_3$ | $y_4$ | $y_5$ | $y_6$ |
|---|---|---|---|---|---|---|---|---|---|
| A | A | F | D | 1 | 0 | 0 | 0 | 0 | 0 |

TABLE 13-continued

| | $I_1$ | $I_2$ | $I_3$ | $y_1$ | $y_2$ | $y_3$ | $y_4$ | $y_5$ | $y_6$ |
|---|---|---|---|---|---|---|---|---|---|
| B | A | B | D | 0 | 1 | 0 | 0 | 0 | 0 |
| C | C | F | C | 0 | 0 | 1 | 0 | 0 | 0 |
| D | C | B | D | 0 | 0 | 0 | 1 | 0 | 0 |
| E | E | B | C | 0 | 0 | 0 | 0 | 1 | 0 |
| F | E | F | C | 0 | 0 | 0 | 0 | 0 | 1 |

A summary of the transitions for the Table 13 flow table are shown in Table 14:

TABLE 14

| | $0 \to 1$ | Input | $1 \to 0$ | Input |
|---|---|---|---|---|
| $Y_1$ | $B \to A$ | $I_1$ | $A \to F$ | $I_2$ |
| | | | $A \to D$ | $I_3$ |
| $Y_2$ | $D \to B$ | $I_2$ | $B \to A$ | $I_1$ |
| | $E \to B$ | $I_2$ | $B \to D$ | $I_3$ |
| $Y_3$ | $D \to C$ | $I_1$ | $C \to F$ | $I_2$ |
| | $E \to C$ | $I_3$ | | |
| | $F \to C$ | $I_3$ | | |
| $Y_4$ | $A \to D$ | $I_3$ | $D \to C$ | $I_1$ |
| | $B \to D$ | $I_3$ | $D \to B$ | $I_2$ |
| $Y_5$ | $F \to E$ | $I_1$ | $E \to B$ | $I_2$ |
| | | | $E \to C$ | $I_3$ |
| $Y_6$ | $A \to F$ | $I_2$ | $F \to E$ | $I_1$ |
| | $C \to F$ | $I_2$ | $F \to C$ | $I_3$ |

First the enable terms are determined from the flow table:

$Y_1 = y_2 I_1(1)$ $Y_2 = y_4 I_2 1) + y_5 I_2(1)$ $Y_3 = y_4 I_1(1) + y_5 I_3(1) + y_6 I_3(1)$ $Y_4 = y_1 I_3(1) + y_2 I_3(1)$ $Y_5 = y_6 I_1(1)$ $Y_6 = y_1 I_2(1) + y_3 I_2(1)$

Next the disable terms are determined from the flow table:

$Y_1 = y_2 I_1(1) + y_1 I_2(0) + y_1 I_3(0)$ $Y_2 = y_4 I_2(1) + y_5 I_2(1) + y_2 I_1(0) + y_2 I_3(0)$ $Y_3 = y_4 I_1(1) + y_5 I_3(1) + y_6 I_3(1) + y_3 I_2(0)$ $Y_4 = y_1 I_3(1) + y_2 I_3(1) + y_4 I_1(0) + y_4 I_2(0)$ $Y_5 = y_6 I_1(1) + y_5 I_2(0) + y_5 I_3(0)$ $Y_6 = y_1 I_2(1) + y_3 I_2(1) + y_6 I_1(0) + y_6 I_3(0)$

Figure 11:
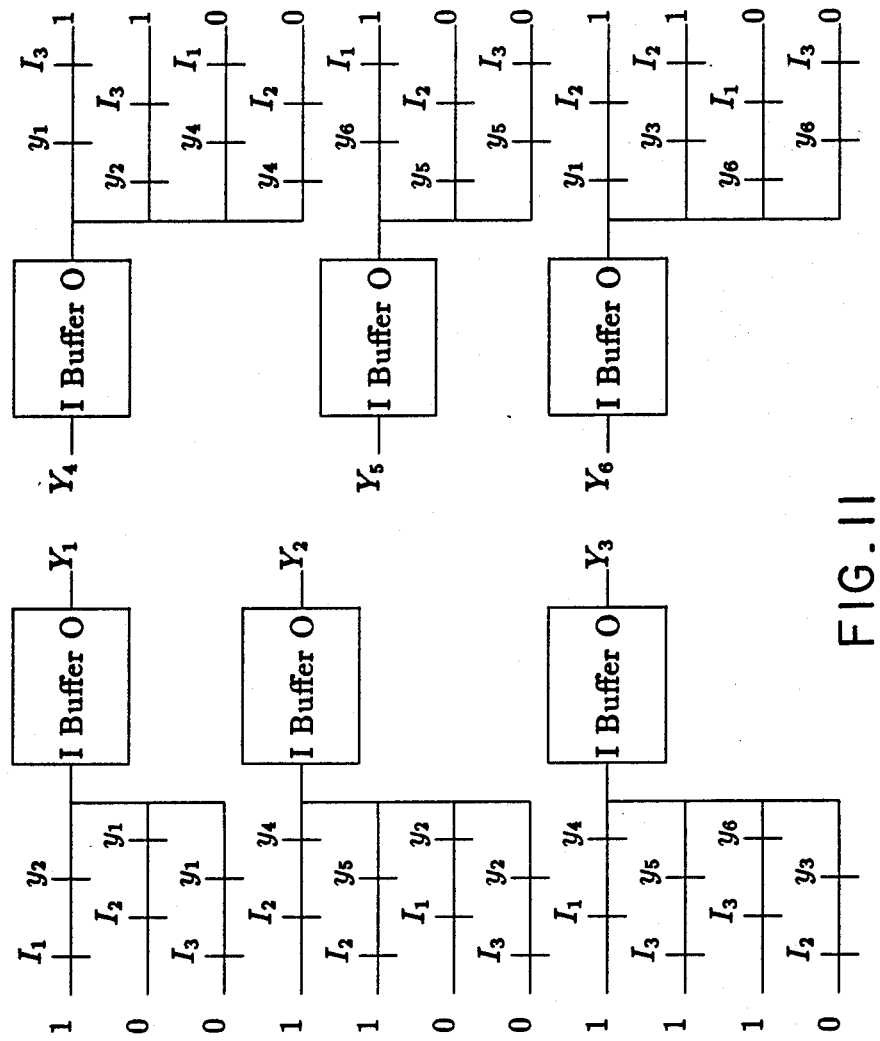
FIG. 11 is a circuit diagram of a circuit, including six component pass transistor networks, designed in accord with a special case of a third embodiment of the inventive method.

FIG. 11 illustrates the implementation of these six design equations, with NMOS pass transistor networks followed by buffer states. The procedure just described can be generalized as follows, to allow design by inspection from the state diagram. When the machine is in state $S_b$, if $I_1$ is asserted high, the machine transitions into state $S_a$. The machine is in state $S_b$, if $I_1$ is asserted high, the machine transitions into state $S_a$. The machine remains in state $S_a$ until either $I_2$ or $I_3$ is asserted. This can be written as $Y_1 = y_2 I_1(1) + y_1 I_2(0) + y_1 I_3(0)$. The enable network which brings the machine into state $S_a$ from $S_b$ is $y_2 I_1(1)$ and the terms $y_1 I_2(0) + y_1 I_3(0)$ form the disable circuit which takes the machine of out state $S_a$ when either $I_2$ or $I_3$ is asserted.

The following essential hazard is associated with the one-hot-code state assignment described above. If the capacitive load seen by the output of the jth component pass network of the circuit is much greater than that seen by the ith network, $c_j >> C_i$, the circuit might enter state 000000, which is a stable invalid state. The difference in delay through each pass network is thus a design consideration. Essentially, the difference in delay through the jth pass network and the delay through ith pass network must be less than the delay through the corresponding buffer circuits.

Assume that a circuit implemented with a one-hot-code state assignment is transitioning from state $S_1$ to $S_2$. If capacitance seen by the output of the pass network for $Y_1$ is much much greater than network $Y_2$, the circuit would transition from $[y_1] \rightarrow [y_1 y_2] \rightarrow [y_2]$. Since $\mu_{disable1} = y_1 I_j(0)$, this transition will complete successfully. If, however, the delay for the pass network $Y_2$ is much much greater than for network $Y_1$, the circuit would attempt to transition from $[y_1] \rightarrow [\ ] \rightarrow [y_2]$ where [ ] is the all zero state. Since $\mu_{enable2} = y_1 I_k(1)$, this transition will fail to complete. As stated earlier, this can be avoided if the difference in delay through any two pass networks is less than the delay through each corresponding buffer circuit.

However, the following implementation of the one-hot-code state assignment eliminates the above-described essential hazard in the disable and enable pass transistor networks, and eliminates the circuit design constraint recited in the preceding sentence. If the circuit is constrained to allow only one state variable to change at a time as a circuit transitions between states, there will be no races and hence no critical races. By using unit distant transitions between states, only one state variable is allowed to change at a time. This type of state operation is called "non-normal" mode.

This is not a STT state assignment and therefore the cost of obtaining an essential hazard free design, using unit distant state transitions as described, will be that the circuit will operate more slowly. By using an assignment in which each state has a distance of two from all other states, there will be two successive state variable changes required for each flow table state transition. The resulting circuit will operate at half the speed of a corresponding circuit designed with an STT assignment.

The state assignment problem for non-normal mode operation is similar to that of STT operation, and the critical criterion is that transition paths of different k-sets (or transition pairs) must not contain states in common. The transition paths must be partitioned so that they are disjoint. Transistion paths for non-normal operation are more difficult to characterize than for an STT assignment. For example, suppose state $S_a$ transitions to $S_b$, and $S_a$ was coded as 000 and $S_b$ as 111. One transition path is $000 \rightarrow 001 \rightarrow 011 \rightarrow 111$. Another transition path is $000 \rightarrow 100 \rightarrow 110 \rightarrow 111$. There are a total of 6 unique paths in this case, all equally valid.

We have recognized that all transition paths are disjoint for the case where no state is both a successor and predecessor state. To understand this, it is helpful to let $[y_i y_j y_k \ldots y_n]$ represent a state where each element of the set is a state variable equal to 1 and all other state variables are equal to 0. For example, $[y_2 y_3]$ would be those states where $y_2$ and $y_3$ are 1 and all other state variables are 0. If state $S_i$ transitions to $S_j$, then the transition path consists of the states $[y_i],[y_i y_j]$ and $[y_j]$ such that $[y_i] \rightarrow [y_i y_j] \rightarrow [y_j]$. There are three states in the transition path. No states with more than two 1's are not members of any transition path.

The transition path for transition $S_i \rightarrow S_j$ is $[y_i]$, $[y_i y_j]$ and $[y_j]$. The state assignment and associated transition paths produce a valid design if the transition path for $(S_i, S_j)$ is disjoint from all other transition paths. Clearly, the only state that is of concern is $[y_i y_j]$ and it must be shown that it is a member of only one transition path. State variable $y_j$ is excited only when a states transitions to $S_j$, that is $S_k \rightarrow S_j$ or when $S_j$ transitions to some other state $S_j \rightarrow S_k$. In both cases, state $[y_j y_k]$ is entered. If $s_k \neq S_i$, then $[y_i y_j]$ is not the same state as $[y_j y_k]$ and the paths are disjoint. Moreover, since no state is both a successor and predecessor state to some other state, there cannot be a transition $S_j \rightarrow S_i$. Therefore, $[y_i y_j]$ is entered only for the transition $S_i \rightarrow S_j$ and at no other time, and cannot be an element of some other transition path.

Under the conditions set forth in the two preceding paragraphs, where no state is both a successor and predecessor state, then it is within the scope of the invention for the design for $Y_i$ to be $y_k I_p(1) + y_i y_j(0)$, where $S_k$ is the predecessor state to $S_i$, and $S_j$ is a successor state of $S_i$. The basis for this aspect of the invention may be understood by considering state $S_i$ where $y_i = 1$, and the transition cases where $S_k \rightarrow S_i$ under input $I_p$. The design equations for $Y_i$ and $Y_k$ are $$Y_i = y_k I_p(1) + y_i y_j(0)$$

$$Y_k = y_i y_k(0) + \ldots$$

When the circuit is in $S_k$, state $[y_k]$ is assumed. When $I_p$ is true, then $y_i \rightarrow 1$ and state $[y_i y_k]$ is assumed. When $[y_i y_k]$ is true then $y_i y_k(0)$ forced $Y_k \rightarrow 0$ and $[y_i]$ is entered. As explained in the two preceding paragraphs, $[y_i y_k]$ belongs only to the transition path of $(S_k, S_i)$ and therefore the transition $S_k \rightarrow S_i$ is properly effected. Transitioning out of $S_i$ occurs in the same manner as transitioning out of $S_k$. When another input is true, $y_j \rightarrow 1$ which in turn causes the circuit to assume $[y_i y_j]$ which forced $[y_i \rightarrow 0]$.

An important version of the third embodiment of the inventive method thus includes the following steps:
1. Encode the flow table with a one-hot-code state assignment; and
2. For each state $S_i$ that is stable under input signal $I_j$, with associated state variable $y_i$ where $y_i = 1$,
   (a) for each state transition from unstable state $S_k$ to stable state $S_i$, introduce an enable term $y_k I_j(1)$ into the design for next state variable $Y_i$; and
   (b) for each state transition from stable state $S_i$ to unstable state $S_j$, introduce a disable term $y_i y_j(0)$ into the design for variable $Y_i$.

For example, for a transition from $S_a \rightarrow S_b$ under $I_2$ shown in the partial flow table of Table 15, the design procedure described immediately above will introduce an enable term for $S_b$ such that $Y_2 = y_1 I_2(1)$.

TABLE 15

|   | $I_1$ | $I_2$ | $y^1$ | $y_2$ |
|---|---|---|---|---|
| A | A | B | 1 | 0 |
| B | — | B | 0 | 1 |

This term will cause the transition $[y_1] \rightarrow [y_1 y_2]$. The design procedure will also introduce the disable term $Y_1 = y_1 y_2(0)$ into state $S_a$ thus forming a handshake.

We have also recognized that a valid design for $Y_i$ is $Y_i = y_j I_p(1) + y_i y_j I_n(0)$, where $S_j$ is both a predecessor and successor state to $S_i$, such that $S_i \rightarrow S_j$ under $I_p$ and $S_j \rightarrow S_i$ under $I_r$. This can be understood by assuming that the transition path for transition $S_i \rightarrow S_j$ under $I_k$ is $[y_i]$, $[y_iy_j]$ and $[y_j]$, and that the transition path for transition $S_j \rightarrow S_i$ under $I_m$ is $[y_j]$, $[y_jy_i]$ and $[y_i]$. Clearly, $[y_iy_j] = y_jy_i]$. If the input state is added to the internal state then the transition path for $S_i \rightarrow S_j$ under $I_k$ is $[y_i]$, $[y_iy_jI_k]$ and $[y_j]$ and the transition path for $S_j \rightarrow S_i$ under $I_m$ is $[y_j$, $[y_jy_iI_m]$ and $[y_i]$. As long as $I_k$ and $I_m$ are guaranteed never to be high at the same time, then the transition paths are disjoint.

Scale of two loops are common in flow tables, such as Table 16:

TABLE 16

|   | $I_1$ | $I_2$ | $y^1$ | $y_2$ |
|---|---|---|---|---|
| A | A | A | B | 1 | 0 |
| B | B | A | B | 0 | 1 |

Figure 15:
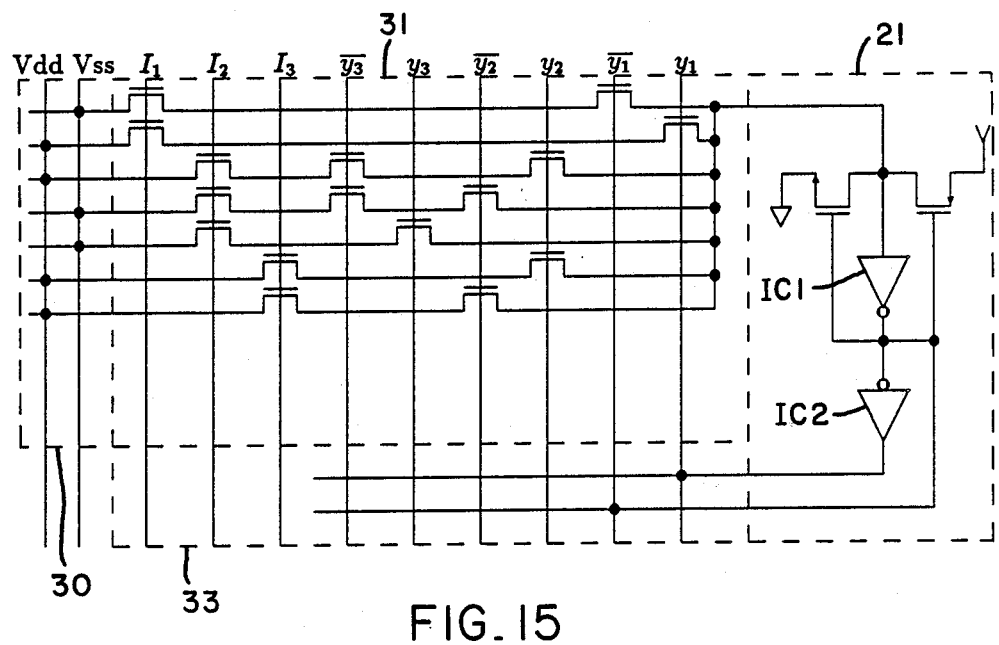
FIG. 15 is a more detailed version of the FIG. 12 diagram.

If the flow table of Table 15 were altered to introduce a scale of two loop as shown in Table 16, the design procedure employed with reference to FIG. 15 would not be useful since $S_a$ is both a predecesssor and successor state of $S_b$ and the transition paths are not disjoint. However, as explained in the preceding paragraph, the input variable can be introduced in the design equation to partition the transition paths.

Another important version of the third embodiment thus includes the following steps:
1. Encode the flow table with a one-hot-code state assignment; and
2. For each state $S_i$ that is stable under $I_j$, with associated state variable $y_i = 1$,
   (a) for each state transition from unstable state $S_k$ to state $S_i$, introduce an enable term $y_kI_j(1)$ into the design for variable $Y_i$, and
   (b) for each state transition from stable state $S_i$ to unstable state $S_k$ caused by $I_m$, introduce a disable term $y_iy_kI_m(0)$ into the design for next state variable $Y_i$.

For example, for a transition from $S_1 \rightarrow S_b$ under $I_2$ shown in the flow table of Table 16, the design procedure described immediately above will introduce an enable term for $S_b$ such that $Y_2 = y_1I_2(1)$. This term will cause the transition $[y_1] \rightarrow [y_1y_2]$. The design procedure will also introduce the disable term $Y_1 = y_1y_2I_2(0)$ into state $S_a$ forming a handshake and causing the transition $[y_1y_2] \rightarrow [y_2]$. The transition from $S_b \rightarrow S_a$ under $I_1$ requires an enable term for $S_a$ such that $Y_1 = y_2I_1(1)$. This term will cause the transition $[y_2] \rightarrow [y_2y_1]$. The design procedure will also introduce the disable term $Y_2 = y_1y_2I_2(0)$ into state $S_b$ thus forming a unique handshake and causing the transition $[y_2y_1] \rightarrow [y_1]$.

As another example, the design procedure of the two preceding paragraphs will next be used to design a circuit implementing the flow table listed in Table 17:

TABLE 17

|   | $I_1$ | $I_2$ | $I_3$ | $y^1$ | $y_2$ | $y_3$ | $y_4$ | $y_5$ | $y_6$ |
|---|---|---|---|---|---|---|---|---|---|
| A | A | A | F | D | 1 | 0 | 0 | 0 | 0 | 0 |
| B | B | A | B | D | 0 | 1 | 0 | 0 | 0 | 0 |
| C | C | C | F | C | 0 | 0 | 1 | 0 | 0 | 0 |
| D | D | C | B | D | 0 | 0 | 0 | 1 | 0 | 0 |
| E | E | E | B | C | 0 | 0 | 0 | 0 | 1 | 0 |
| F | F | E | F | C | 0 | 0 | 0 | 0 | 0 | 1 |

The first step is to assign a one-hot-code to the flow table. This assignment is shown in Table 17.

Derivation of the design equations can again be understood by studying the flow table. A state variable makes a 0→1 transition when entering the state which requires that variable to be asserted. This is accomplished by a term in the design equation qualified by the state from which the circuit is transitioning and the input under which the new state is stable and passing a 1. For example, when the machine is in state $S_a$ or $S_c$, if $I_2$ is asserted high the machine will move toward state $S_f$. The enable terms of the design for state variable $Y_6$ can be written as $Y_6 = y_1I_2(1) + y_3I_2(1)$. To guarantee that the machine traverses states $S_a \rightarrow S_f$ such that $[y_1] \rightarrow [y_1y_6] \rightarrow [y_6]$ and $S_a \rightarrow S_d$ such that $[y_1] \rightarrow [y_1y_4] \rightarrow [y_6]$ when leaving stable state $S_a$, the disable terms $y_1y_6I_2(0)$ and $y_1y_4I_3(0)$ are introduced into the design equation for $Y_1$, thus forming a handshake.

First the enable terms are read from the flow table:

$Y_1 = y_2I_1(1)$ $Y_2 = y_4I_2(1) + y_5I_2(1)$ $Y_3 = y_4I_1(1) + y_5I_3(1) + y_6I_3(1)$ $Y_4 = y_1I_3(1) + y_2I_3(1)$ $Y_5 = y_6I_1(1) +$ $Y_6 = y_1I_2(1) + y_3I_2(1)$

The entire design equations with the disable terms are:

$Y_1 = y_2I_1(1) + y_1y_6I_2(0) + y_1y_4I_3(0)$ $Y_2 = y_4I_2(1) + y_5I_2(1) + y_2y_1I_1(0) + y_2y_4I_3(0)$ $Y_3 = y_4I_1(1) + y_5I_3(1) + y_6I_3(1) + y_3y_6I_2(0)$ $Y_4 = y_1I_3(1) + y_2I_3(1) + y_4y_3I_1(0) + y_4y_2I_2(0)$ $Y_5 = y_6I_1(1) + y_5y_2I_2(0) + y_5y_3I_3(0)$ $Y_6 = y_1I_2(1) + y_3I_2(1) + y_6y_5I_1(0) + y_6y_3I_3(0)$

Figure 12:
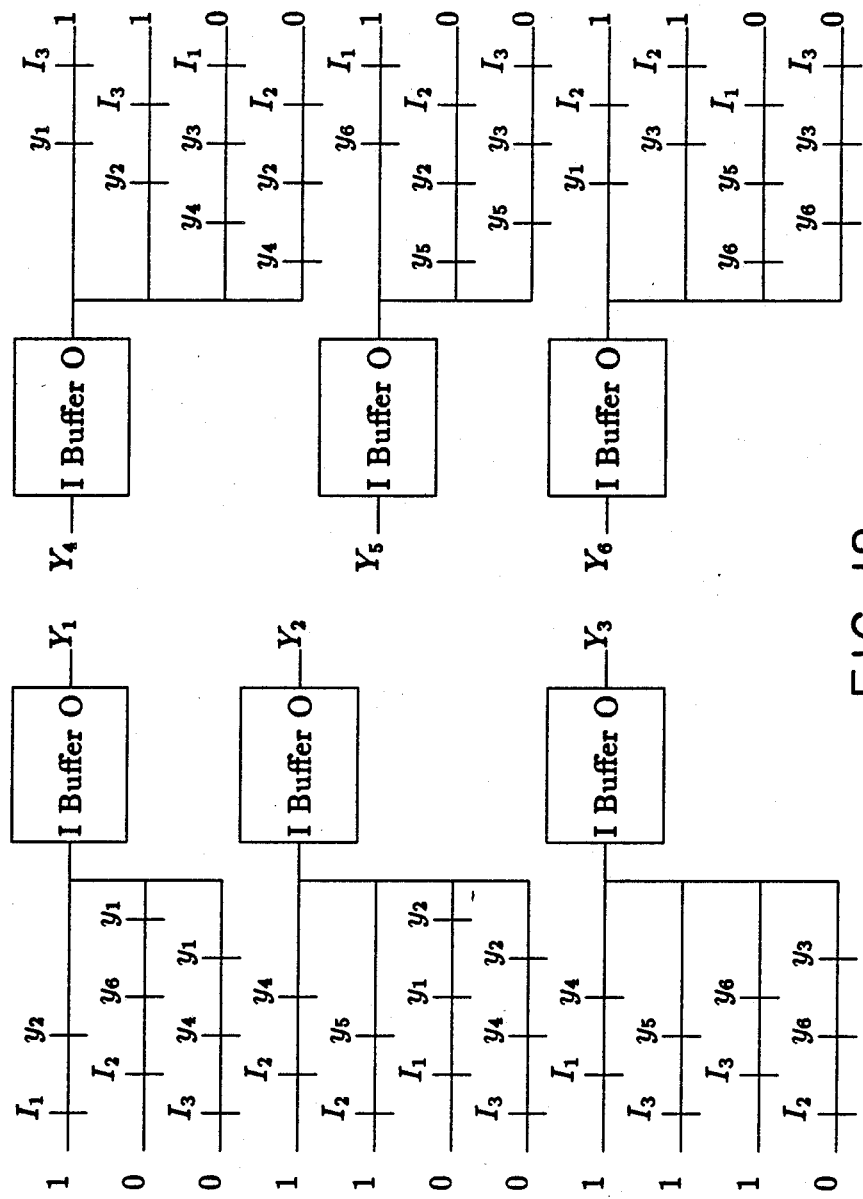
FIG. 12 is a circuit diagram of a circuit, including six component pass transistor networks, designed in accord with another special case of the third embodiment of the inventive method.

The logical implementation of the circuit is shown in FIG. 12.

To summarize, the third embodiment of the inventive method applies to circuits where only a portion of the entire transition path is covered by a partition, namely, only the portion containing an unstable state. Variations of the third embodiment using a one-hot-code state assignment, and using handshake code state assignment have been described.

The circuit designs produced using the handshake code are free of critical races and hazards. The handshaking in a sense arbitrates differences in delays. Most electronic circuit design constraints are eliminated for the circuit designs produced using such handshake code. The cost of eliminating these design constraints is reduced speed of operation. For a circuit design based on a non-normal code, the handshake code causes the circuit to function at half the speed of an STT state assignment based circuit. The only constraint in the design of handshake code state assignment based circuits is that the inputs must not have 1—1 cross over, but this constraint is readily satisfied by the two alternative means set forth above in the specification.

Synchronous sequential circuits can be constructed with well structured PLA architectures, which results in reduced layout, verification, and design costs. Structured designs also are more easily set up for programmatic generation. Attempts at structured asynchronous sequential circuit design have been pursued in the past. However, the inventive asynchronous architecture described below is believed to be the first that can be programmed in a manner similar to a synchronous PLA.

The circuits designed in accord with the first and second embodiments of the inventive method, using the Tracey, Liu and Tan state assignments, include pass transistor networks which are identical in structure for each state variable. The personalization of the networks for the individual state variables results from the input pass variables applied to each network of the circuit. The number of paths in each state variable network is a function of the flow table, not the state assignment, and is equal to the number of partitions $P_k$. We have recognized that this architecture is suitable for establishing a structured layout.

Figure 13:
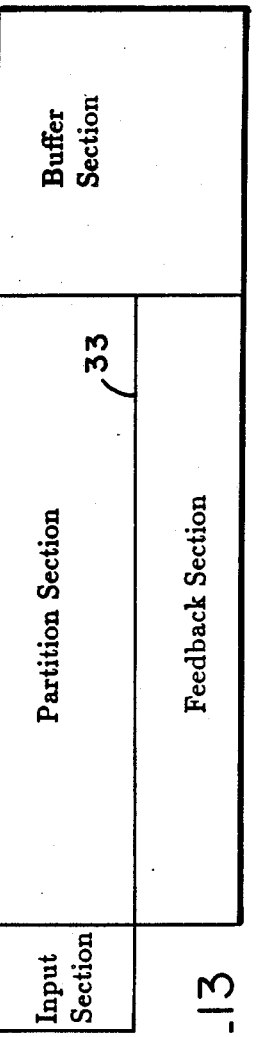
FIG. 13 is a simplified diagram of the preferred layout for a circuit designed in accord with the first preferred embodiment of the inventive method.

By examining the circuit diagram of FIG. 6 and the circuit input matrix in Table 6, it becomes apparent that three distinct circuit sections are shown and a fourth is implied. Such four-section architecture is shown in FIG. 13. The input section of FIG. 6 (corresponding to input section 30 of FIG. 13) is a coding of 1's and 0's to program the state assignment for a given state variable. The pass transistor logic section (corresponding to partition section 31 of FIG. 13) programs the structure of the flow table into the sequential circuit and is identical for each state variable $Y_i$. The buffer section (corresponding to buffer section 32 of FIG. 13) restores the threshold drop on the 1 level out of the pass network, and if the latching buffer of FIG. 9 is used to implement section 32, eliminates essential hazards on 0—0 cross over of the inputs. The fourth section (corresponding to programmable feedback section 33 of FIG. 13), which is implied if the FIG. 6 circuit is to be programmed by a computer ("programmatically generated"), is a programmable feed back section.

Figure 14:
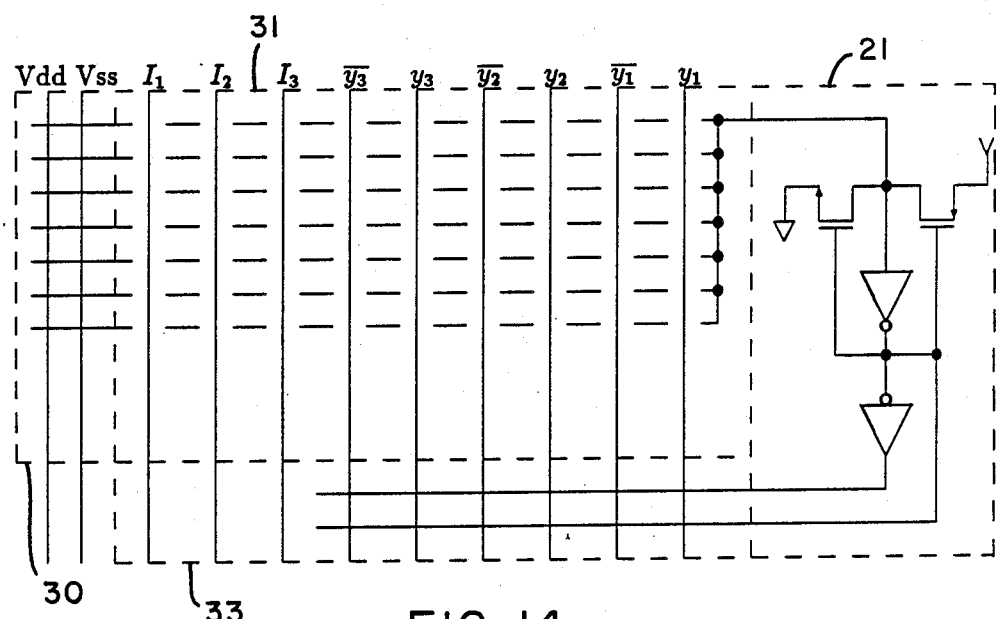
FIG. 14 is a more detailed version of the FIG. 11 diagram.

By overlaying the FIG. 13 architectural block diagram with the logic elements, the layout form can be envisioned. FIG. 14 shows the general logic/layout form. Buffer 21 requires one input and two outputs along with power supply lines. In FIG. 14, latching buffer 21 functions as buffer section 32, and is driven by the output of the pass variable lines in partition section 31. Buffer 21 is preferably a cell which fits the height of a minimum number of partition variable lines. Feedback section 33 receives both signals from the buffer in one layer of interconnect arranged so that a contact can be dropped to the layer driving potential gates in the partition section. Partition section 31 includes arrays, each having a series structure, driven by state variables, and primary inputs that can be programmed. The programming may be accomplished with transistor structures and jumper connections. Input section 30 consists of Vdd and Vss supply lines which are programmaged by contacts on the input node lines to the pass transistor array.

The programming features needed by the architecture shown in FIG. 14 can be more easily seen by an example. FIG. 15 shows an overlay of the logic for state variable $Y_1$ from the transition path Liu state assignment circuit of FIG. 6. The feedback section 33 has contacts programmed to connect the buffer outputs to the $y_1$ and $\overline{y_1}$ lines driving through the pass network. Transistors and jumpers are programmed in partition section 31 to create the required pass network. The input variables shown in Table 7 are programmed as connections to the Vdd and Vss supply lines running the input section 30.

The other state variables are likewise formed by changing the feedback and input programming and abutting the cells together. The complete circuit described with reference to Table 7 (of which FIG. 6 is a portion) is shown in a 1.5 micron CMOS double metal N-well process in FIG. 16.

The feedback lines comprising feedback section 33 of FIG. 16 are composed of a first metal, which is programmed by dropping to the poly lines feeding the gates in the partition section 31. The size of the machine (93.2 $\mu$m by 121.6 $\mu$m) allowed the state lines and input lines to run in poly. No second metal is used in partition section 31 so that these lines could be run in such second metal for machines requiring a large number of state variables or a large number of partition lines.

The pass transistor matrix is programmed with either a diffusion-contact-first metal transistor structure or a first metal jumper. The transistors in the pass transistor network are sized so that the metal overlap of the contact rule is just met, forming minimum capacitance structures, and allowing maximum speed.

Input section 30 has Vdd and Vss lines running in the second metal with the programming vias dropping to first metal lines feeding the pass array. The state variable lines (composed of the first metal) are passed out of the cell under the Vdd and Vss lines of input section 30 to drive external requirements.

The pass network transistors of FIG. 16 is preferably sized to minimize the node diffusion at $W_n = 3.2$ $\mu$m. The first buffer inverter is preferably sized with a $W_p = 6.4$ $\mu$m p-channel transistor. The n-channel transistor is the same size to lower the switch point of the inverter in order to compensate for the threshold loss on the first metal level out of the pass transistor array (section 31). Second inverter IC2 in the buffer is also sized with $W_p = W_n = 6.4$ $\mu$m to minimize 1—1 cross over of the state variables and avoid any potential essential hazards. The feedback devices are weak transistors with $W_p = 2.8$ $\mu$m, $L_p = 5.0$ $\mu$m, $W_n = 2.8$ $\mu$m and $L_n = 10.4$ $\mu$m, whose sizes are set to insure proper operation when these devices ratio with the pass network.

The FIG. 16 state machine occupies an area of 93.2 $\mu$m by 121.6 $\mu$m. The layout density is 171.7 $\mu$m$^2$ (0.266 mil$^2$) per transistor or 54.75 $\mu$m$^2$ (0.085 mil$^2$) per transistor site. By comparison, a single standard cell D flip-flop in this same 1.5 $\mu$m double metal CMOS process is 70.4 $\mu$m by 139.2 $\mu$m [19]. The layout of FIG. 16, which contains a three input, five stage, three state variable, state machine occupies an area only 1.16 times that of a single standard cell D flip-flop drawn in the same 1.5 $\mu$m double metal CMOS process.

Parasitic capacitances were extracted from the layout and a conventional SPICE simulation was run to determine the operating frequency of the FIG. 16 state machine. Worst case speed 3$\sigma$ parameters were used in the simulation along with high temperature, $T_j = 100°$ C., a low power supply Vdd = 4.5 V, and supply bus drops of 0.2 V. The inputs were assumed to have a rise and fall time of 1.0 nsec. Under these assumptions, the circuit ran in fundamental mode for 30 MHz input changes.

Typical speed parameters were then used in another simulation along with room temperature, $T_j = 25°$ C., and typical power supply, Vdd = 5 V. The inputs were again assumed to have a rise and fall time of 1.0 nsec. Under these assumptions, the circuit ran in fundamental mode for 100 MHz input changes.

The operating speed of the FIG. 16 circuit can be increased by either of two alternative means. First, the buffer may be sized to increase the speed of the state variables at the cost of increased dynamic power. An improvement in speed with no penalty may be achieved by laying out the partition section such that the transistors driven by the circuit inputs are adjacent the output. This layout places the last arriving signal adjacent the pass transistor network output node and maximizes the operating speed.

In order to optimize the operating parameters at the expense of programmability, the logic may be reduced. The reduction in logic for the partition section would reduce the total node capacitance that must be charged in the pass transistor array and would also reduce the gate capacitance driven by the state variable buffers.

To summarize, the first embodiment of the inventive method results in a circuit in which memory is introduced by feedback terms in the combinational logic. The circuit consists of three sections for each state variable: an enable network which arms the circuit to look for input changes which will cause 0→1 transitions, and maintains a state variable for 0→0 transitions; a hold network which arms the circuit to look for input transitions which cause state variables to change from 1→0, and maintains a state variable for 1→1 transitions; and a buffer circuit which buffers the pass transistor network and restores the one level following a pass transistor network. An SST state assignment was employed to avoid the critical race problem inherent in this design. An additional constraint on the use of this design procedure results from essential hazards on the inputs, but this constraint is easily satisfied by passing 1's and 0's under the control of the circuit inputs as described herein.

Tracey, Liu and Tan state assignments may be employed in the first embodiment. Analysis of the hardware bounds for these three state assignment methods concluded that the Liu state assignment method generally results in the smallest circuit.

The second embodiment of the inventive method results in a circuit with separate memory and forming logic circuit elements. The circuit for each state variable consists of three sections: an enable network which arms the circuit to look for input changes which will cause 0→1 transitions in $y_i$; a disable network which arms the circuit to look for input transitions which cause $y_i$ to change from 1→0; and a buffer circuit which performs the buffering and memory function.

STT state assignments are also used in the second embodiment due to their critical race free nature. The number of paths in the pass networks were reduced in comparison with the first embodiment since only transitions need to be covered. The Liu state assignment is again the preferred choice for the simplest circuit. The cross over constraint on the inputs is eliminated to allow 0—0 cross overs. The use of cross coupled NOR gates to eliminate 1—1 cross over in the buffer is a solution to the essential hazards on the state variables.

The third embodiment results in a class of circuits which operate in a non-normal mode. A one-hot handshake code state assignment may be employed in this embodiment for designing this class of circuits. It is within the scope of the invention to employ the one-hot handshake code described herein, to produce circuits free from critical races and hazards since they operate in a self arbitrated manner.

VLSI layout techniques are also described which establish a programmable circuit format. By having a programmable layout structure, the increased cost of layout, verification, and design for a random logic circuit can be avoided. The inventive layout facilitates programmatic generation.

We have recognized that the first embodiment of the inventive design method is also applicable to design synchronous sequential circuits, if the buffer is replaced by a clocked D flip-flop. Critical races and most hazard conditions can be ignored in most synchronous designs since the sampling clock avoids the resulting adverse effects.

The foregoing is merely illustrative and explanatory of the inventive method and apparatus. Various changes in the component sizes and shapes, and other details of the embodiments described herein may be within the scope of the appended claims.

What is claimed is:

1. A method for designing an asynchronous sequential circuit comprising a pass transistor network, including the steps of:
   (a) generating a flow table indicative of the desired characteristics of the circuit, and encoding each present state variable, $y_i$, of the flow table with a state assignment; and
   (b) generating from the encoded flow table a circuit design for each next state variable, $Y_i$, of the circuit, wherein each said circuit design corresponds to a portion of the pass transistor network receiving a set of 1 input signals $I_j$, and wherein each said partial circuit design has form $$Y_i = \sum_{j=1}^{1} \sum_{k=1}^{m_j} p_k I_j(x_{kj}),$$

where $p_k I_j(x_{kj})$ represents a pass transistor path which decodes a transition path to a stable state $S_k$ under one of said input signals $I_j$, bit $x_{kj}$ is the jth bit of state $S_k$, each $p_k$ is a partition of the present state variables under said input signal $I_j$, and $m_j$ is the number of partitions under said input signal $I_j$.

2. The method of claim 1, wherein the step (b) is performed in such a manner that each said partial circuit design has identical form, except that each said partial circuit design has a different set of input signals, $I_j(x_{kj})$.

3. The method of claim 1, wherein step (a) includes the operation of encoding the flow table with a single transition time state assignment.

4. The method of claim 1, wherein the circuit is a critical race free pass transistor asynchronous sequential circuit, the circuit also comprises a buffer without a long-term-memory, for receiving the output of the pass transistor network, wherein step (a) includes the operation of encoding the flow table with a single transition time state assignment, and wherein step (b) includes the operations of:
   (c) generating each partition $p_k$ of the circuit's present state variables under each input signal $I_j$ of the flow table, each said partition being associated with a stable internal state of the circuit, and each said partition including a block corresponding to a transition pair or k-set of said stable internal state;
   (d) for each state variable index, i, each said partition $p_k$, and each input signal $I_j$, if the ith bit in the stable state of $p_k$ for input signal $I_j$ is equal to one, including the term $p_k I_j(1)$ in the design for next state variable $Y_i$, and if the ith bit in the stable state of $p_k$ for input signal $I_j$ is equal to zero, including the term $p_k I_j(0)$ in the design for next state variable $Y_i$; and (e) generating a state variable product expression for each partition $p_k$, by producing a covering by said each partition $p_k$ of the transition path to the stable state of said each partition $p_k$, and substituting the state variable product expressions for the corresponding partitions $p_k$ in the designs for the next state variables $Y_i$.

5. The method of claim 1, also including the step of:
(f) constructing the pass transistor asynchronous sequential circuit in accordance with the designs for the next state variables $Y_i$.

6. The method of claim 1, wherein the circuit includes an input section for receiving the input signals, a logic section including a pass transistor matrix for implementing the flow table, and a buffer section for receiving output signals emerging from the logic section, and wherein step (f) includes the steps of: connecting the input section to the logic section; and connecting the buffer section to the logic section.

7. The method of claim 6, wherein the circuit also includes a feedback section for receiving buffered signals emerging from the buffer section and routing them to the logic section, and wherein step (f) includes the step of: connecting the feedback section between the buffer section and the logic section.

8. The method of claim 7, wherein the circuit also includes metal lines connecting the feedback section with the buffer section, and a gate line feeding each pass transistor, and wherein step (f) includes the step of: programming the logic section by connecting each feedback line with at least one of the gate lines.

9. The method of claim 6, including the step of: programming the pass transistor matrix with a diffusion-contact-metal transistor structure.

10. The method of claim 6, including the step of: programming the pass transistor matrix with a metal jumper.

11. The method of claim 1, wherein the circuit is an asynchronous circuit comprising an enable pass transistor network, a disable pass transistor network, and a memory-containing buffer for receiving the output of both pass transistor networks, wherein step (a) includes the operation of encoding the flow table with a single transition time state assignment, and wherein step (b) includes the operations of:

(c) generating each partition $p_k$ of the circuit's present state variables under each input variable $I_j$ of the flow table, each said partition being associated with a stable internal state of the circuit, and each said partition including a block corresponding to a transition pair or k-set of said stable internal state;

(d) for each state variable index, i, each said partition $p_k$, and each input variable $I_j$, if the block of the partition $p_k$ corresponds to a transition path in which present state variable bit $y_i$ undergoes a transition from zero to one, including the term $p_k I_j(1)$ in the design for next state variable $Y_i$, and if the block of the partition $p_k$ corresponds to a transition path in which present state variable bit $y_i$ undergoes a transition from one to zero, including the term $p_k I_j(0)$ in the design for next state variable $Y_i$; and (e) generating a state variable product expression for each partition $p_k$, by producing a covering by said each partition $p_k$ of the transition path to the stable state of said each partition $p_k$, and substituting the state variable product expressions for the corresponding partitions $p_k$ in the designs for the next state variables $Y_i$.

12. The method of claim 11, wherein the memory-containing buffer is a latching buffer.

13. The method of claim 1, wherein the circuit is a critical race free, asynchronous circuit comprising an enable pass transistor network, a disable pass transistor network, and a memory-containing buffer for receiving the output of both pass transistor networks, wherein the enable and disable pass transistor networks present a high impedance to the buffer, wherein the design for each next state variable $Y_i$ includes a term of form $p_k I_j(x_{kj})$ only for each pass transistor path which decodes a transition path to a stable state $S_k$ under an input $I_j$ in which a present state variable $y_i$ undergoes a change in value, and wherein step (b) includes the operations of:

(c) generating each partition $p_k$ of the circuit's present state variables under each input signal $I_j$, each said partition being associated with a stable internal state of the circuit, and each said partition including a block corresponding to a transition pair or k-set of said stable internal state;

(d) for each state variable index, i, each said partition $p_k$, and each input signal $I_j$, if the block of the partition $p_k$ corresponds to a transition path in which present state variable bit $y_i$ undergoes a transition from zero to one, including the term $p_k I_j(1)$ in the design for next state variable $Y_i$, and if the block of the partition $p_k$ corresponds to a transition path in which present state variable bit $y_i$ undergoes a transition from one to zero, including the term $p_k I_j(0)$ in the design for next state variable $Y_i$; and (e) generating a state variable product expression for each partition $p_k$, by producing a covering by said each partition $p_k$ of only the portion of the transition path to the stable state of said each partition $p_k$ which contains an unstable state, and substituting the state variable product expressions for the corresponding partitions $p_k$ in the designs for the next state variables $Y_i$.

14. The method of claim 13, wherein the flow table comprises states $S_i$ for each input signal $I_j$, where i is a non-negative integer less than or equal to n, and wherein step (a) includes the operation of encoding the flow table with a one-hot-code state assignment with present state variable $y_i$ equal to one in state $S_i$.

15. The method of claim 14, wherein step (b) includes the operations of:
for each state transition from unstable state $S_k$ to state $S_i$ under input signal $I_j$, including the enable term $y_k I_j(1)$ in the design for next state variable $Y_i$; and
for each state transition from unstable state $S_p$ to unstable state $S_j$ under input signal $I_k$, including the disable term $y_i I_k(0)$ in the design for next state $Y_i$.

16. The method of claim 14, wherein the circuit is constrained to operate in a non-normal mode in which only one state variable is allowed to change at a time.

17. The method of claim 14, wherein the circuit is constrained to operates in a non-normal mode in which two state variable changes are required for each state transition.

18. The method of claim 17, wherein step (b) includes the operations of:

for each internal state $S_i$ of the flow table that is stable under input signal $I_j$, and for each state transition from unstable state $S_k$ to state $S_i$, including the enable term $y_k I_j(1)$ in the design for the next state variable $Y_i$; and for each internal state $S_j$ of the flow table that is unstable under input signal $I_j$, and for each state transition from stable state $S_i$ to state $S_j$, including the disable term $y_i y_j(0)$ in the design for next state $Y_i$.

19. The method of claim 17, wherein step (b) includes the operations of:

for each internal state $S_i$ of the flow table that is stable under input signal $I_j$, and for each state transition from unstable state $S_k$ to state $S_i$, including the enable term $y_k I_j(1)$ in the design for next state variable $Y_i$; and for each state transition from stable state $S_i$ to unstable state $S_k$ caused by input signal $I_m$, including the disable term $y_i y_k I_m(0)$ in the design for next state variable $Y_i$.

20. An asynchronous sequential circuit for receiving a set of 1 input signals, $I_j$, and implementing a function defined by a flow table, where each present state variable, $y_i$, of the flow table is encoded with a state assignment, including:

a pass transistor network consisting of network portions, where each of the network portions determines one of a set of next state variables $Y_i$ in response to the status of the present state variables and the input signals, and where each network portion has a design of form $$Y_i = \sum_{j=1}^{1} \sum_{k=1}^{m_j} p_k I_j(x_{kj}),$$

where $p_k I_j(x_{kj})$ represents a pass transistor path which decodes a transition path to a stable state $S_k$ of the circuit under one of the input signals $I_j$, bit $x_{kj}$ is the jth bit of the state $S_k$, each $p_k$ is a partition of the present state variables under said input signal $I_j$, and $m_j$ is the number of partitions under said input signal $I_j$.

21. The circuit of claim 20, wherein each of the pass transistor network portions has identical structure, but each of the pass transistor network portions may receive a different set of input signals.

22. The circuit of claim 20, wherein the flow table is encoded with a single transition time state assignment.

23. The circuit of claim 20, wherein the circuit is a critical race free pass transistor asynchronous sequential circuit, wherein the flow table is encoded with a single transition time state assignment, and also including: a buffer, without a long-term memory, for receiving the output of the pass transistor network.

24. The circuit of claim 23, wherein a state variable product expression is substituted for each partition $p_k$ in the design of each network portion, where each said state variable product expression corresponds to a covering by each said partition $p_k$ of the transition path to the stable state of said each partition $p_k$, each said partition $p_k$ of the circuit's present state variables under each input variable $I_j$ of the flow table is associated with a stable internal state of the circuit, and each said partition $p_k$ includes a block corresponding to a transition pair or k-set of said stable internal state, and where the design for each next state variable $Y_i$ includes the term $p_k I_j(1)$ for each state variable index, i, each said partition $p_k$, and each input variable $I_j$, if the ith bit in the stable state of $p_k$ for input variable $I_j$ is equal to one, and the design for each next state variable $Y_i$ includes the term $p_k I_j(0)$ if the ith bit in the stable state of $p_k$ for input variable $I_j$ is equal to zero.

25. The circuit of claim 20, also including:

an input section connected to the pass transistor network, for receiving the input signals; and a buffer section connected to the pass transistor network, for receiving output signals emerging from the pass transistor network.

26. The circuit of claim 25, also including:

a feedback section connected between the buffer section and the pass transistor network, for receiving buffered signals emerging from the buffer section and routing them to the pass transistor network.

27. The circuit of claim 26, also including:

metal lines for connecting the feedback section with the buffer section; and a gate line feeding each pass transistor in the pass transistor network, and wherein each feedback line is connected with at least one of the gate lines.

28. The circuit of claim 25, wherein the pass transistor network is programmable with a diffusion-contact-metal transistor structure.

29. The circuit of claim 25, wherein the pass transistor network is programmable with a metal jumper.

30. The circuit of claim 20, wherein the pass transistor network includes an enable pass transistor network and a disable transistor network, wherein the flow table is encoded with a single transition time state assignment, and also including:

a memory-containing buffer for receiving the output of the enable pass transistor network and the disable pass transistor network; and wherein a state variable product expression is substituted for each partition $p_k$ in the design of each network portion, where each said state variable product expression corresponds to a covering by said each partition $p_k$ of the transition path to the stable state of said each partition $p_k$, wherein each partition $p_k$ of the circuit's present state variables under each input variable $I_j$ of the flow table is associated with a stable internal state of the circuit, and each said partition $p_k$ includes a block corresponding to a transition pair or k-set of said stable internal state, and where the design for each next state variable $Y_i$ includes the term $p_k I_j(1)$ if the block of the partition $p_k$ corresponds to a transition path in which present state variable bit $y_i$ undergoes a transition from zero to one, where the design for each next state variable $Y_i$ includes the term $p_k I_j(0)$ if the block of the partition $p_k$ corresponds to a transition path in which present state variable bit $y_i$ undergoes a transition from one to zero.

31. The circuit of claim 30, wherein the memory-containing buffer is a latching buffer.

32. The circuit of claim 20, wherein the circuit is a critical race free, asynchronous circuit, and wherein the pass transistor network includes an enable pass transistor network and a disable pass transistor network, and also including:

a memory-containing buffer for receiving the output of the enable pass transistor network and the disable pass transistor network, wherein the enable and disable pass transistor networks present a high impedance to the buffer.

33. The circuit of claim 32, wherein the design for each next state variable $Y_i$ includes a term of form $p_k I_j(x_{kj})$ only for each pass transistor path which decodes a transition path to a stable state $S_k$ under an input $I_j$ in which a present state variable $y_i$ undergoes a change in value, and wherein a state variable product expression is substituted for each partition $p_k$ in the design of each network portion, where each said state variable product expression corresponds to a covering by said each partition $p_k$ of only the portion of the transition path to the stable state of said each partition $p_k$ which contains an unstable state, wherein each partition $p_k$ of the circuit's present state variables under each input variable $I_j$ of the flow table is associated with a stable internal state of the circuit, and each said partition $p_k$ includes a block corresponding to a transition pair or k-set of said stable internal state, and where the design for each next state variable $Y_i$ includes the term $p_k I_j(1)$ if the block of the partition $p_k$ corresponds to a transition path in which present state variable bit $y_i$ undergoes a transition from zero to one, where the design for each next state variable $Y_i$ includes the term $p_k I_j(0)$ if the block of the partition $p_k$ corresponds to a transition path in which present state variable bit $y_i$ undergoes a transition from one to zero.

34. The circuit of claim 33, wherein the flow table comprises states $S_i$ for each input signal $I_j$, where i is a non-negative integer less than or equal to n, and wherein the flow table is encoded with a one-hot-code state assignment with present state variable $y_i$ equal to one in state $S_i$.

35. The circuit of claim 34, wherein the design for each next state variable $Y_i$ includes an enable term of form $y_k I_j(1)$ for each state transition from unstable state $S_k$ to state $S_i$ under input signal $I_j$, and a disable term $y_i I_k(0)$ for each state transition from unstable state $S_p$ to unstable state $S_j$ under input signal $I_k$.

36. The circuit of claim 34, wherein the circuit is constrained to operate in a non-normal mode in which only one state variable is allowed to change at a time.

37. The circuit of claim 34, wherein the circuit is constrained to operates in a non-normal mode in which two state variable changes are required for each state transition.

38. The circuit of claim 37, wherein the design for next state variable $Y_i$ includes the enable term $y_k I_j(1)$ for each internal state $S_i$ of the flow table that is stable under input signal $I_j$, and for each state transition from unstable state $S_k$ to state $S_i$, and wherein the design for next state variable $Y_i$ includes the disable term $y_i y_j(0)$ for each internal state $S_j$ of the flow table that is unstable under input variable $I_j$, and for each state transition from stable state $S_i$ to state $S_j$.

39. The circuit of claim 37, wherein the design for next state variable $Y_i$ includes the enable term $y_k I_j(1)$ for each internal state $S_i$ of the flow table that is stable under input variable $I_j$, and for each state transition from unstable state $S_k$ to state $S_i$, and wherein the design for next state variable $Y_i$ includes the disable term $y_i y_k I_m(0)$ for each state transition from stable state $S_i$ to unstable state $S_k$ caused by input variable $I_m$.

* * * * *

REEXAMINATION CERTIFICATE (1914th)
United States Patent [19]
Maki et al.

[11] B1 4,912,348

[45] Certificate Issued Jan. 26, 1993

[54] METHOD FOR DESIGNING PASS TRANSISTOR ASYCHRONOUS SEQUENTIAL CIRCUITS

[75] Inventors: Gary K. Maki; Sterling R. Whitaker, both of Moscow, Id.

[73] Assignee: Idaho Research Foundation, Moscow, Id.

Reexamination Request:
No. 90/002,556, Feb. 19, 1992

Reexamination Certificate for:
Patent No.: 4,912,348
Issued: Mar. 27, 1990
Appl. No.: 282,308
Filed: Dec. 9, 1988

[51] Int. Cl.$^5$ .................. H04Q 1/00; H03K 17/693; H03K 19/096; H03K 3/01
[52] U.S. Cl. .................. 307/465; 307/468; 307/469; 307/465.1; 364/716; 364/784; 340/825.84; 340/825.86; 340/825.87; 340/825.91
[58] Field of Search .................. 307/465–469, 307/443; 364/716, 488, 489, 784; 340/825.83, 825.84, 825.86, 825.87, 825.91

[56] References Cited

U.S. PATENT DOCUMENTS

| | | | |
|---|---|---|---|
| 3,400,379 | 9/1968 | Harman | 235/156 |
| 4,453,096 | 6/1984 | Le Can et al. | 307/448 |
| 4,541,067 | 9/1985 | Whitaker | 364/716 |
| 4,566,064 | 1/1986 | Whitaker | 364/300 |
| 4,622,648 | 11/1986 | Whitaker | 364/715 |
| 4,808,844 | 2/1989 | Ozaki et al. | 307/465.1 X |
| 4,825,107 | 4/1989 | Naganuma et al. | 307/465 |
| 4,857,773 | 8/1989 | Takata et al. | 307/465 |
| 4,857,774 | 8/1989 | El-Ayat et al. | 307/465 |
| 4,870,302 | 10/1989 | Freeman | 307/465 |

OTHER PUBLICATIONS

"Pass-Transistor Networks Optimize n-MOS Logic", Sterling Whitaker, Electronics, Sep. 22, 1983.
"Formal Design Procedures for Pass Transistor Switching Circuits", Damu Radhakrishnan, Sterling R. Whitaker, Gary K. Maki, Journal of Solid-State Circuits, vol. SC-20, No. 2, Apr. 1985.
"Formal Design Procedures for Pass Transistor Switching Circuits", Damu Radhakrishnan, Sterling R. Whitaker, Gary K. Maki, Proceedings of the IEEE Custom Integrated Circuits Conference, May 21–23, 1984.
"State Assignments for Asynchronous Sequential Machines", Chung-Jen Tan, IEEE Transactions on Computers, vol. C-20, No. 4, Apr. 1971.
"A State Variable Assignment Method for Asynchronous Sequential Switching Circuits", C. N. Liu,J.ACM, vol. 10, Apr. 1963, pp. 209–216.
"Internal State Assignments for Asynchronous Sequential Machines", James H. Tracey, IEEE Transactions on Electronic Computers, vol. EC-15, No. 4, Aug. 1966.
"A State Assignment Procedure for Asynchronous Sequential Circuits", Gary K. Maki, James H. Tracey, IEEE Transactions on Computers, Jun. 1971.

*Primary Examiner*—Timothy P. Callahan

[57] ABSTRACT

A method for designing and constructing pass transistor asynchronous sequential circuits, and a class of pass transistor asynchronous sequential circuits designed in accordance with the inventive method. The inventive circuit design method generates a design for each next state variable, $Y_i$, of an asynchronous pass transistor circuit, where each design corresponds to a portion of the circuit. In a first preferred embodiment, the invention produces an asynchronous circuit design comprising a pass transistor network and a buffer (having no long term memory) for receiving the output of the pass transistor network. In a second preferred embodiment, the inventive method results in a critical race free, asynchronous circuit design comprising an enable pass transistor network, a disable pass transistor network, and a buffer (including a memory) for receiving the output of both pass transistor networks. In either embodiment, the invention results in circuits comprising pass transistor networks that are identical in structure for each next state variable $Y_i$ (although different sets of constant input signals are applied to each network). It is within the scope of the invention to design and construct circuits having this architecture in accordance with a structured layout including an input section, a logic section implementing the next state functions, a buffer section, and a feedback section. The logic section preferably includes a pass transistor matrix programmed with either a diffusion-contact-metal transistor structure or a metal jumper structure. The feedback lines preferably are metal lines that are programmed by making contact with the gate lines feeding the pass transistors.

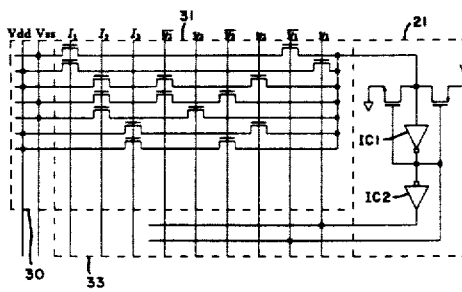

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 20 are determined to be patentable as amended.

Claims 2-19 and 21-39, dependent on an amended claim, are determined to be patentable.

1. A method for designing an asynchronous sequential circuit comprising a pass transistor network, including the steps of:
    (a) generating a flow table indicative of [the] desired characteristics of the circuit, and encoding each present state variable, $y_i$, of the flow table with a state assignment; and
    (b) generating from the encoded flow table a *partial* circuit design for each next state variable, $Y_i$, of the circuit, wherein each said *partial* circuit design corresponds to a portion of the pass transistor network receiving a set of 1 input signals $I_j$, and wherein each said partial circuit design has form $$Y_i = \sum_{j=1}^{l} \sum_{k=1}^{m_j} p_k I_j(x_{kj})$$

where $p_k I_j(X_{kj})$ represents a pass transistor path which decodes a transition path to a stable state $S_k$ under one of said input signals $I_j$, bit $X_{kj}$ is [the] *a* jth bit of state $S_k$, each $p_k$ is a partition of the present state variables under said input signal $I_j$, and $m_j$ is the number of partitions under said input signal $I_j$.

20. An asynchronous sequential circuit for receiving a set of 1 input signals, $I_j$, and implementing a function defined by a flow table, where each present state variable, $y_i$, of the flow table is encoded with a state assignment, including:
    a pass transistor network consisting of network portions, where each of the network portions determines one of a set of next state variables $Y_i$ in response to [the] *a* status of the present state variables and the input signals, and where each network portion has a design of form $$Y_i = \sum_{j=1}^{l} \sum_{k=1}^{m_j} p_k I_j(x_{kj})$$

where $p_k I_j(X_{kj})$ represents a pass transistor path which decodes a transition path to a stable state $S_k$ of the circuit under one of the input signals $I_j$, bit $x_{kj}$ is [the] *a* jth bit of the state $S_k$, each $p_k$ is a partition of the present state variables under said input signal $I_j$, and $m_j$ is the number of partitions under said input signal $I_j$.

* * * * *